(12) United States Patent
Takagi et al.

(10) Patent No.: US 10,686,001 B2
(45) Date of Patent: Jun. 16, 2020

(54) IMAGE SENSOR AND IMAGE-CAPTURING DEVICE

(71) Applicant: NIKON CORPORATION, Tokyo (JP)

(72) Inventors: Toru Takagi, Fujisawa (JP); Satoshi Nakayama, Sagamihara (JP); Ryoji Ando, Sagamihara (JP); Takashi Seo, Yokohama (JP); Yohei Matsuoka, Berlin (DE); Yoshiyuki Watanabe, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/765,202

(22) PCT Filed: Sep. 26, 2016

(86) PCT No.: PCT/JP2016/078279
§ 371 (c)(1),
(2) Date: Mar. 30, 2018

(87) PCT Pub. No.: WO2017/057278
PCT Pub. Date: Apr. 6, 2017

(65) Prior Publication Data
US 2018/0308889 A1     Oct. 25, 2018

(30) Foreign Application Priority Data

Sep. 30, 2015  (JP) ................................. 2015-195346

(51) Int. Cl.
| | |
|---|---|
| *H01L 27/146* | (2006.01) |
| *H01L 31/0232* | (2014.01) |
| *H04N 5/374* | (2011.01) |

(52) U.S. Cl.
CPC .. *H01L 27/14627* (2013.01); *H01L 27/14603* (2013.01); *H01L 27/14621* (2013.01);
(Continued)

(58) Field of Classification Search
CPC ......... H01L 27/14627; H01L 27/14603; H01L 27/14621; H01L 31/0232; H04N 5/374
(Continued)

(56) References Cited

U.S. PATENT DOCUMENTS

| | | |
|---|---|---|
| 8,773,562 B1 | 7/2014 | Fan |
| 2005/0167704 A1 | 8/2005 | Ezaki et al. |

(Continued)

FOREIGN PATENT DOCUMENTS

| | | |
|---|---|---|
| JP | 2005-223084 A | 8/2005 |
| JP | 2010-212668 A | 9/2010 |

(Continued)

OTHER PUBLICATIONS

Dec. 20, 2016 International Search Report issued in International Patent Application No. PCT/JP2016/078279.
(Continued)

*Primary Examiner* — Tong-Ho Kim
(74) *Attorney, Agent, or Firm* — Oliff PLC

(57) ABSTRACT

An image sensor includes: a photoelectric conversion unit that photoelectrically converts incident light transmitted through a microlens to generate electric charge; an accumulation unit that accumulates the electric charge generated by the photoelectric conversion unit; and a transfer unit that transfers the electric charge generated by the photoelectric conversion unit to the accumulation unit, wherein: the photoelectric conversion unit, the transfer unit, and the accumulation unit are provided along a direction of an optical axis of the microlens.

16 Claims, 18 Drawing Sheets

(52) U.S. Cl.
CPC .... *H01L 27/14645* (2013.01); *H01L 31/0232* (2013.01); *H04N 5/374* (2013.01)

(58) Field of Classification Search
USPC ........................................................ 257/432
See application file for complete search history.

(56) References Cited

U.S. PATENT DOCUMENTS

| | | |
|---|---|---|
| 2010/0230729 A1 | 9/2010 | Ellis-Monaghan et al. |
| 2012/0188397 A1 | 7/2012 | Ohta |
| 2014/0211056 A1 | 7/2014 | Fan |
| 2014/0306276 A1 | 10/2014 | Yamaguchi |
| 2014/0320718 A1 | 10/2014 | Fan |
| 2015/0029374 A1 | 1/2015 | Kitano |
| 2015/0035028 A1* | 2/2015 | Fan .................. H01L 27/14623 257/292 |
| 2015/0129943 A1* | 5/2015 | Kato .................. H01L 27/1461 257/292 |
| 2015/0256769 A1 | 9/2015 | Kim et al. |
| 2016/0020236 A1 | 1/2016 | Tanaka et al. |
| 2016/0043126 A1 | 2/2016 | Fan |
| 2016/0093659 A1 | 3/2016 | Nakamura et al. |
| 2016/0126266 A1 | 5/2016 | Kato et al. |

FOREIGN PATENT DOCUMENTS

| | | |
|---|---|---|
| JP | 2013-084785 A | 5/2013 |
| JP | 2013-098446 A | 5/2013 |
| JP | 5547260 B2 | 7/2014 |
| JP | 2014-199898 A | 10/2014 |
| JP | 2014-225560 A | 12/2014 |
| JP | 2015-095468 A | 5/2015 |
| WO | 2013/065569 A1 | 5/2013 |
| WO | 2013/118646 A1 | 8/2013 |
| WO | 2014/120447 A1 | 8/2014 |

OTHER PUBLICATIONS

May 28, 2019 Office Action isused in Japanese Patent Application No. 2017-543260.
Jul. 8, 2019 Partial Supplemental European Search Report issued in European Patent Application No. 16851449.5.
Jun. 24, 2019 Office Action issued in Korean Patent Application No. 2018-7008396.
Oct. 29, 2019 Extended European Search Report in European Application No. 16851449.5.
Dec. 4, 2019 Office Action issued in Korean Application No. 10-2018-7008396.
Jan. 21, 2020 Office Action issued in Japanese Patent Application No. 2017-543260.
Feb. 7, 2020 Office Action issued in Korean Patent Application No. 2018-7008396.

* cited by examiner

- Si n-TYPE REGION
- Si p-TYPE REGION
- Si p+ REGION
- POLYSILICON
- OXIDE FILM
- NITRIDE FILM
- METAL
- SUPPORT SUBSTRATE

FIG.16
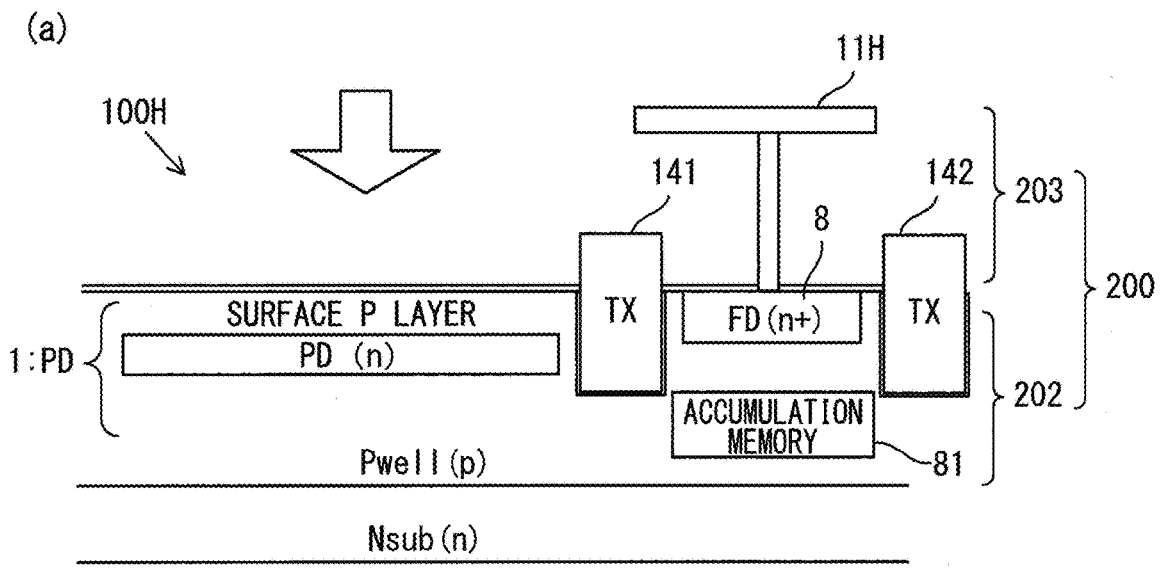
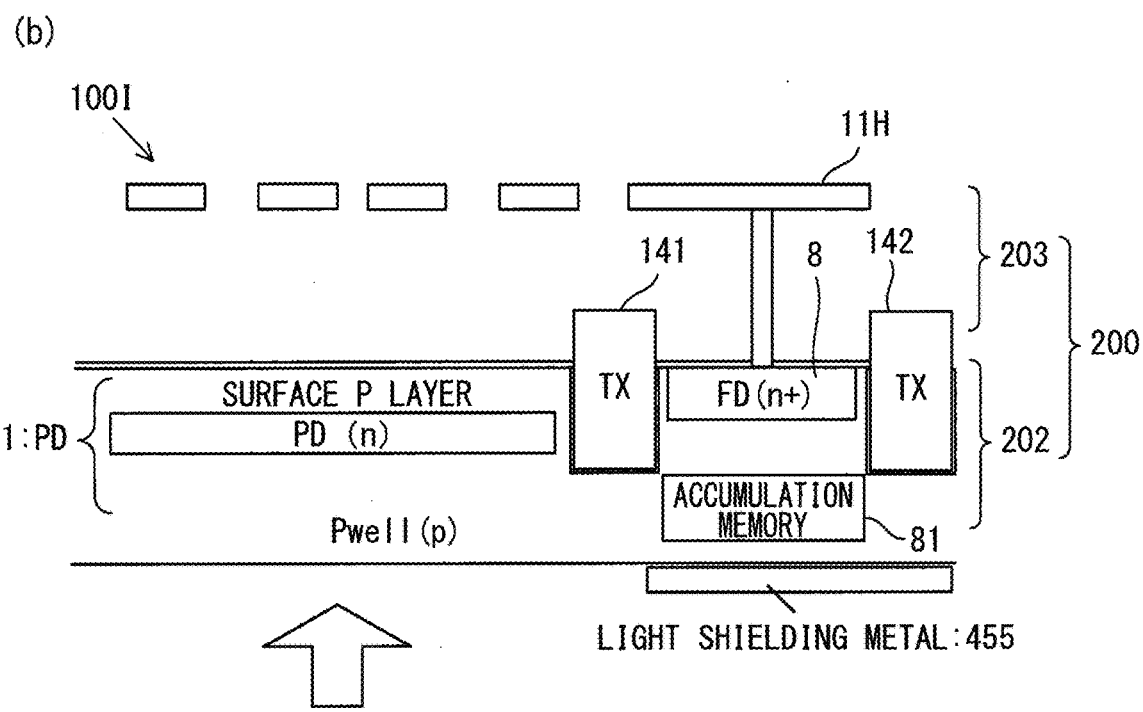

IMAGE SENSOR AND IMAGE-CAPTURING DEVICE

TECHNICAL FIELD

The present invention relates to an image sensor and an image-capturing device.

BACKGROUND ART

PTL1 discloses the following solid-state image sensor.

A semiconductor substrate is provided with an image-capturing region including a photoelectric conversion unit and a signal scan circuit unit and having unit pixels arranged in a matrix. The image-capturing region includes an field isolation insulating film that is provided to correspond to a boundary part between adjacent pixels and surround each pixel; a MOSFET provided on a front surface of the semiconductor substrate and in a region below the field isolation insulating film; and a first diffusion layer having a first conductivity type provided in a region in the vicinity of the field isolation insulating film in the semiconductor substrate. The field isolation insulating film is provided in the semiconductor substrate at an offset from the front surface of the semiconductor substrate on which the signal scan circuit unit is formed, and reaches a back surface of the semiconductor substrate. The MOSFET includes a gate electrode and a second diffusion layer having the first conductivity type formed in the semiconductor substrate and above the gate electrode. The first diffusion layer and the second diffusion layer contact each other. In a vertical direction of the semiconductor substrate, the center of the width of the first diffusion layer along a first direction orthogonal to the vertical direction is located in the vicinity of the center of the width of the second diffusion layer along the first direction.

CITATION LIST

Patent Literature

PTL1: Japanese Patent No. 5547260

SUMMARY OF INVENTION

There has been a recent trend toward solid-state image sensors having an increased number of pixels. In conventional solid-state image sensors, however, the increased number of pixels leads to a smaller light receiving area because a first diffusion layer and a second diffusion layer are arranged along a surface of a semiconductor substrate. As the light receiving area is reduced, the amount of electric charge generated by photoelectric conversion decreases, which can lead to a deterioration in the sensitivity.

According to the first aspect of the present invention, an image sensor comprises: a photoelectric conversion unit that photoelectrically converts incident light transmitted through a microlens to generate electric charge; an accumulation unit that accumulates the electric charge generated by the photoelectric conversion unit; and a transfer unit that transfers the electric charge generated by the photoelectric conversion unit to the accumulation unit. The photoelectric conversion unit, the transfer unit, and the accumulation unit are provided along a direction of an optical axis of the microlens.

According to the second aspect of the present invention, an image sensor comprises: a first surface and a second surface that intersect an optical axis of a microlens; a photoelectric conversion unit that photoelectrically converts incident light transmitted through the microlens between the first surface and the second surface to generate an electric charge; an accumulation unit that accumulates the electric charge generated by the photoelectric conversion unit; and a transfer unit that transfers the electric charge generated by the photoelectric conversion unit to the accumulation unit. With respect to a direction of the optical axis of the microlens, the photoelectric conversion unit is arranged on the first surface side, the accumulation unit is arranged on the second surface side, and the transfer unit is arranged between the photoelectric conversion unit and the accumulation unit.

According to the third aspect of the present invention, an image-capturing device comprises: an image sensor; and a generation unit that generates image data based on a signal outputted from the image sensor. The image sensor comprises: a photoelectric conversion unit that photoelectrically converts incident light transmitted through a microlens to generate electric charge; an accumulation unit that accumulates the electric charge generated by the photoelectric conversion unit; and a transfer unit that transfers the electric charge generated by the photoelectric conversion unit to the accumulation unit. The photoelectric conversion unit, the transfer unit, and the accumulation unit are provided along a direction of an optical axis of the microlens.

According to the fourth aspect of the present invention, an image-capturing device comprises: an image sensor; and a generation unit that generates image data based on a signal outputted from the image sensor. The image sensor comprises: a first surface and a second surface that intersect an optical axis of a microlens; a photoelectric conversion unit that photoelectrically converts incident light transmitted through the microlens between the first surface and the second surface to generate an electric charge; an accumulation unit that accumulates the electric charge generated by the photoelectric conversion unit; and a transfer unit that transfers the electric charge generated by the photoelectric conversion unit to the accumulation unit. With respect to a direction of the optical axis of the microlens, the photoelectric conversion unit is arranged on the first surface side, the accumulation unit is arranged on the second surface side, and the transfer unit is arranged between the photoelectric conversion unit and the accumulation unit.

BRIEF DESCRIPTION OF DRAWINGS

FIG. 16(a) is a cross-sectional view of a pixel 20 in an eighth embodiment and FIG. 16(b) is a cross-sectional view of a pixel 20 in a ninth embodiment.

DESCRIPTION OF EMBODIMENTS

First Embodiment

Schematic Element Structure

Figure 1:
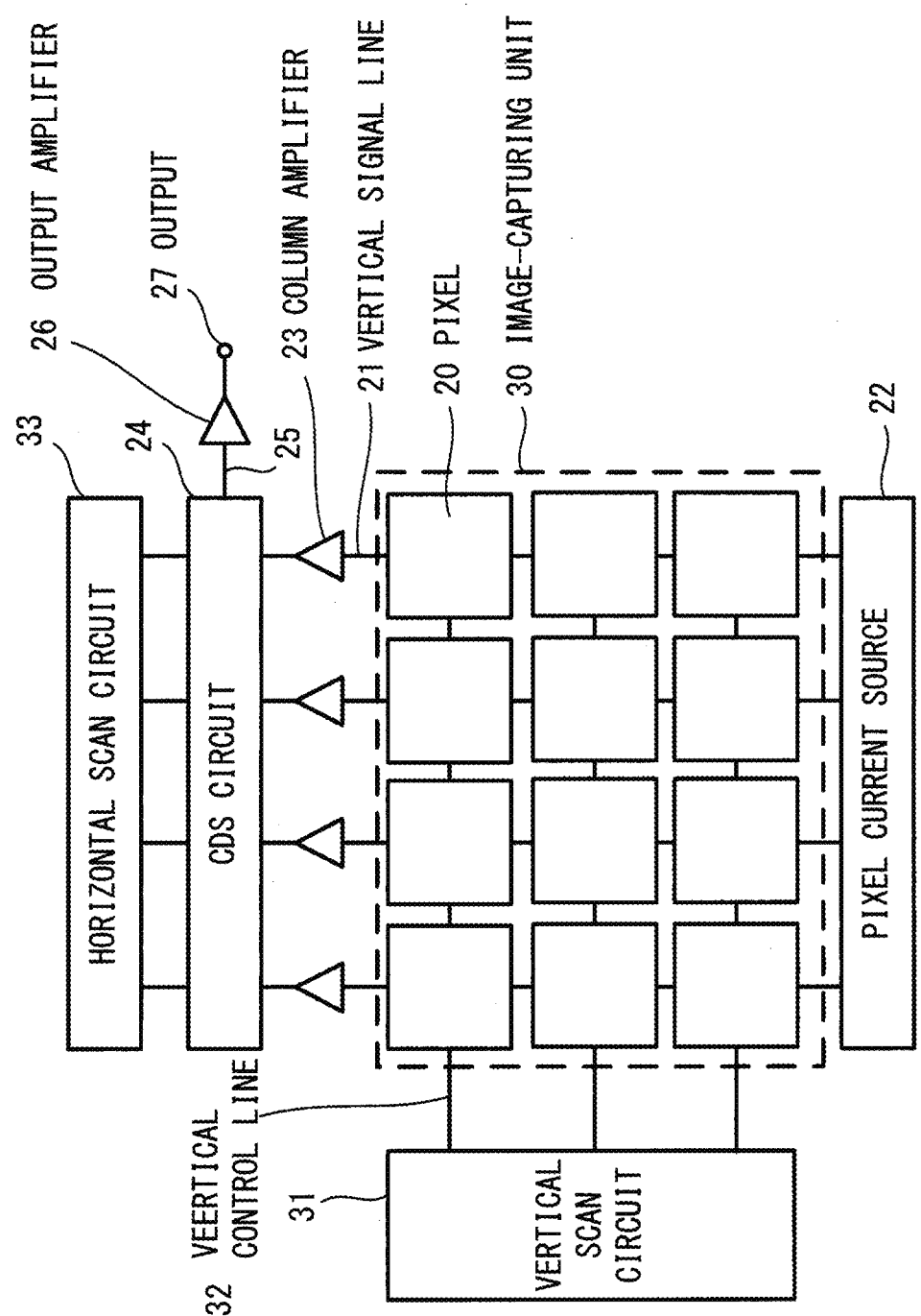
FIG. 1 is a view illustrating a schematic configuration of a solid-state image sensor 100 according to a first embodiment.

FIG. 1 is a view illustrating a schematic configuration of a solid-state image sensor 100 according to a first embodiment. The solid-state image sensor 100 includes an image-capturing unit 30 having pixels 20 arranged on a light receiving surface (a light incident surface). The pixels 20 are supplied with drive signals from a vertical scan circuit 31 via vertical control lines 32. Further, the pixels 20 are connected to vertical signal lines 21 on a column basis. The vertical signal lines 21 are connected to a pixel current source 22.

Furthermore, noise outputs and signal outputs that are time-divisionally outputted from the pixels 20 to the vertical signal lines 21 are sequentially inputted to a CDS circuit (a correlated double sampling circuit) 24 via column amplifiers 23. The CDS circuit 24 calculates a difference between both outputs to generate a true signal output. This true signal output is horizontally scanned by a drive signal from a horizontal scan circuit 33 and sequentially outputted to a horizontal signal line 25. A signal output of the horizontal signal line 25 is outputted to an output terminal 27 via an output amplifier 26.

Equivalent Circuit of Pixel 20

Figure 2:
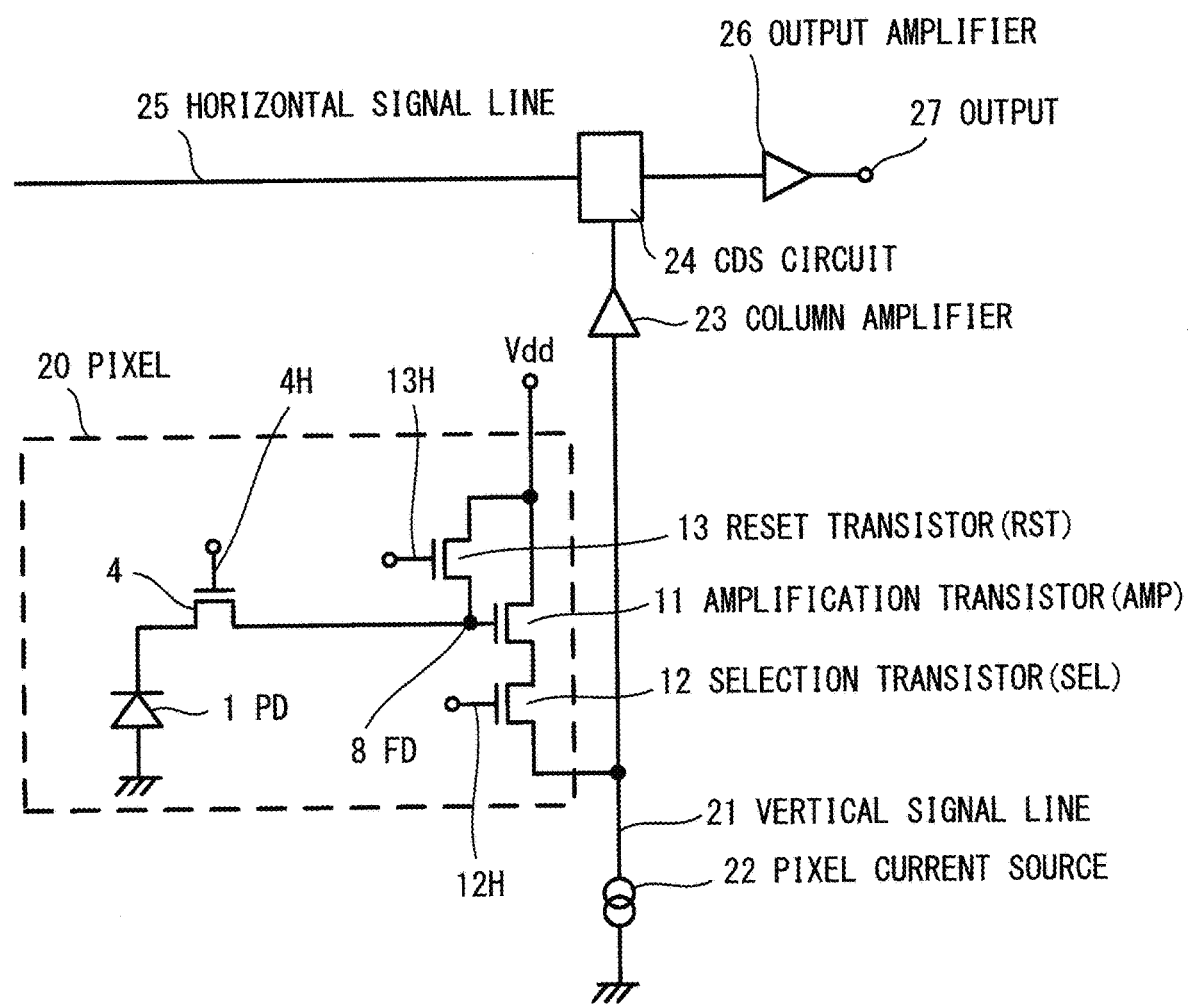
FIG. 2 is a view illustrating an equivalent circuit of a pixel 20 of the first embodiment.

FIG. 2 is a view illustrating an equivalent circuit of the pixel 20 described above. The pixel 20 is provided with a photodiode (PD) 1. The PD 1 is connected to a floating diffusion (FD) 8 via a transfer transistor (TG: hereinafter also referred to as a transfer gate) 4 which is gate-controlled by a transfer drive signal (a transfer gate voltage). The FD 8 is connected to a gate electrode of an amplification transistor (AMP) 11. The FD 8 is also connected to a reference potential Vdd via a reset transistor (RST: hereinafter also referred to as a reset gate) 13 which is gate-controlled by a reset drive signal (a reset gate voltage). The amplification transistor 11 has a drain connected to the potential Vdd and a source connected to the vertical signal line 21 via a selection transistor (SEL: hereinafter also referred to as a selection gate) 12 which is gate-controlled by a selection drive signal (a selection gate voltage).

The transfer gate voltage of the transfer transistor 4 is supplied via a transfer wiring 4H. The reset gate voltage of the reset transistor 13 is supplied via a reset wiring 13H. The selection gate voltage of the selection transistor 12 is supplied via a selection wiring 12H. The transfer wiring 4H, the reset wiring 13H, and the selection wiring 12H are formed in a wiring region (a wiring layer) 203 in the substrate having the PD 1 and the FD 8 formed thereon.

Other configurations are the same as those in FIG. 1 and repetitive description thereof will thus be omitted herein.

Element Structure of Pixel 20

Figure 3:
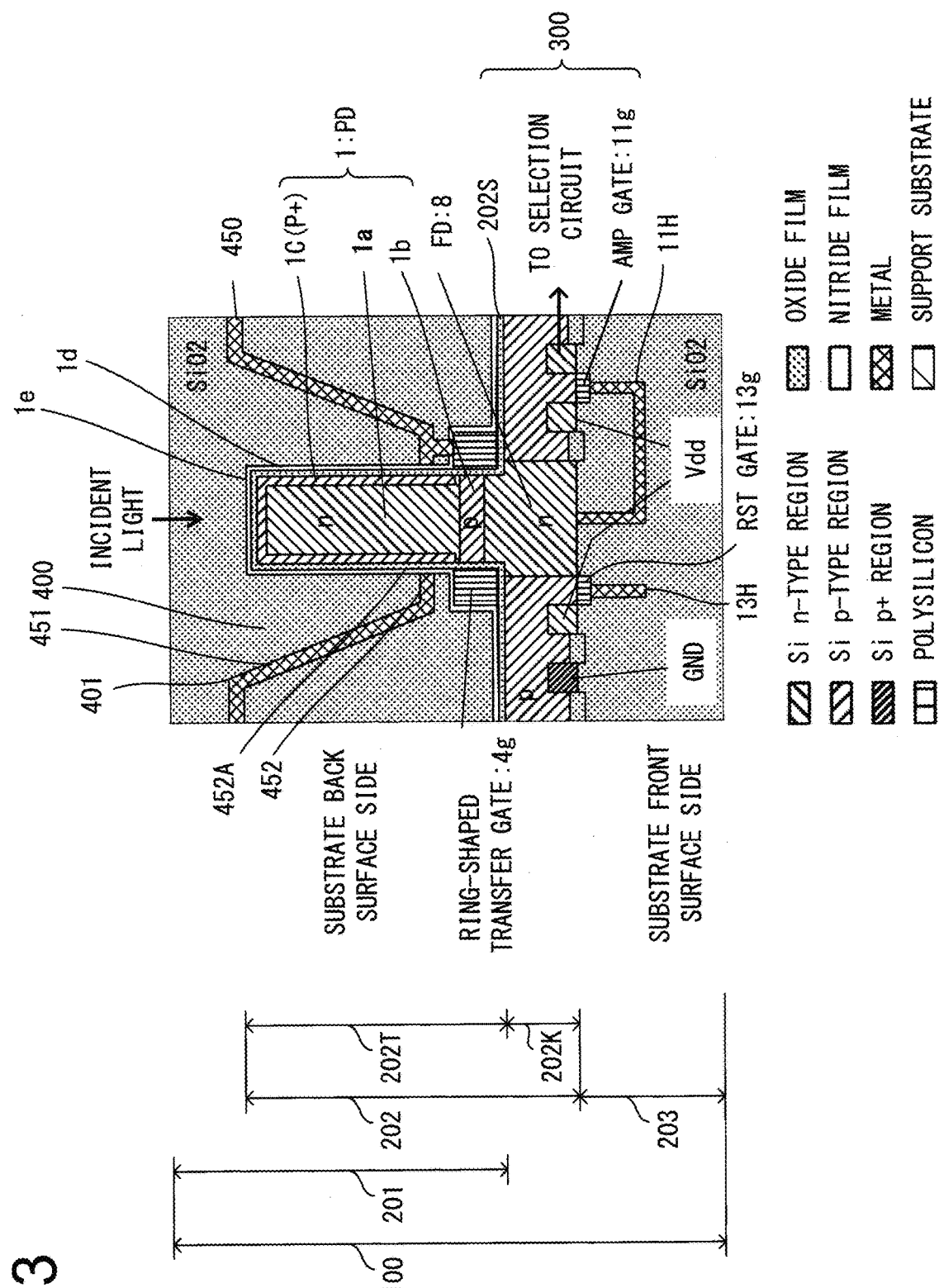
FIG. 3 is a cross-sectional view of the pixel 20 in the first embodiment.

FIG. 3 is a cross-sectional view illustrating a part of an element structure of the pixel 20. Incident light enters from above in FIG. 3.

The solid-state image sensor 100 is formed on a semiconductor substrate 200. The semiconductor substrate 200 is a monolithic semiconductor substrate. The semiconductor substrate 200 is composed of generally three layers laminated from top (a light receiving surface side) to bottom (a wiring region side) in FIG. 3. An oxide film 201 is formed as the uppermost layer, a wiring region 203 is formed as the lowermost layer, and a diffusion region 202 is formed between the oxide film 201 and the wiring region 203. The diffusion region 202 is also referred to as a semiconductor region. The wiring region 203 is formed by oxide layer, except for wiring portion. It should be noted that the oxide film and the oxide layer are a film and a layer mainly having a region formed by oxidizing the semiconductor substrate.

Semiconductor Region 202

The semiconductor region (the diffusion region) 202 of the semiconductor substrate 200 is provided with vertically elongated PDs 1 that extend in a thickness direction (a light incident direction) of the substrate and signal readout circuits 300 that are disposed in an in-plane direction of the substrate. The semiconductor region 202 has a base region 202K as a thin layer and a protruding region 202T extending from the base region 202K to the side of the light receiving surface onto which light enters. The PDs 1 are formed in the protruding region 202T, and the signal readout circuits 300 are formed in the base region 202K. The PDs 1 and the signal readout circuits 300 are formed by selectively implanting a p-type impurity and an n-type impurity into predetermined portions of a p-type region at an appropriate concentration.

The semiconductor region 202 is provided with the PDs 1 converting incident light into electric charges by photoelectric conversion and the signal readout circuits 300 for outputting the electric charges photoelectrically converted by the PDs 1 as pixel signals to the vertical signal lines 21.

The signal readout circuit 300 formed in the semiconductor region 202 includes the transfer transistor 4 which transfers the electric charge of the PD 1 to the FD 8; the FD 8 which accumulates the transferred electric charge and converts it into a voltage; the amplification transistor 11 which amplifies the output voltage of the FD 8; and the reset transistor 13 which resets the FD 8.

The transfer transistor 4 transfers the electric charge generated in the PD 1 to the FD 8 when a gate voltage is applied to a gate electrode 4g. The transfer gate electrode 4g is a ring-shaped electrode formed in the oxide film 201 on the outer periphery of the PD 1. An insulating film (an oxide film) 202S is provided between the transfer gate electrode 4g and the semiconductor region 202. The ring-shaped transfer gate electrode 4g will be described hereinafter.

The transfer transistor 4 is a transistor formed at a p-n junction of a transfer path (channel) which transfers the electric charge photoelectrically converted by the PD 1 to the FD 8 when a gate voltage is applied to the gate electrode 4g. A p region 1b, which serves as the transfer path, is arranged between the PD 1 and the FD 8 along the light incident direction. In other words, the PD 1, the p region 1b, and the FD 8 are arranged in this order from the light receiving surface side onto which light enters, to the wiring region side.

The FD 8 is a capacitor that accumulates the electric charge transferred from the transfer transistor 4 and converts it into voltage, and is provided in the semiconductor substrate base region 202K under the PD 1. The electric charge generated by photoelectric conversion is converted into voltage by the capacitor of the FD 8, and the voltage serves as the gate voltage of the amplification transistor 11. Since a pixel signal of the pixel 20 is based on a value obtained by dividing the electric charge G generated in the PD 1 by the capacitance C of the FD 8, an reduction in the capacitance of the FD 8 contributes to an improvement in the sensitivity of the image sensor.

The amplification transistor 11 amplifies the voltage of the FD 8 applied to the gate electrode 11g. The voltage amplified by the amplification transistor 11 is outputted to a selection circuit on the other semiconductor substrate (not shown) to be stacked.

It should be noted that the selection circuit formed on the semiconductor substrate not shown includes a selection transistor 12 that outputs the pixel signal, which has been outputted from the amplification transistor 11, to the vertical signal line 21.

The reset transistor 13 discharges the electric charge accumulated in the FD 8 and resets the FD 8 to the reference potential Vdd, when the gate voltage is applied to a gate electrode 13g.

Ring-Shaped Transfer Gate Electrode 4g

Figure 4:
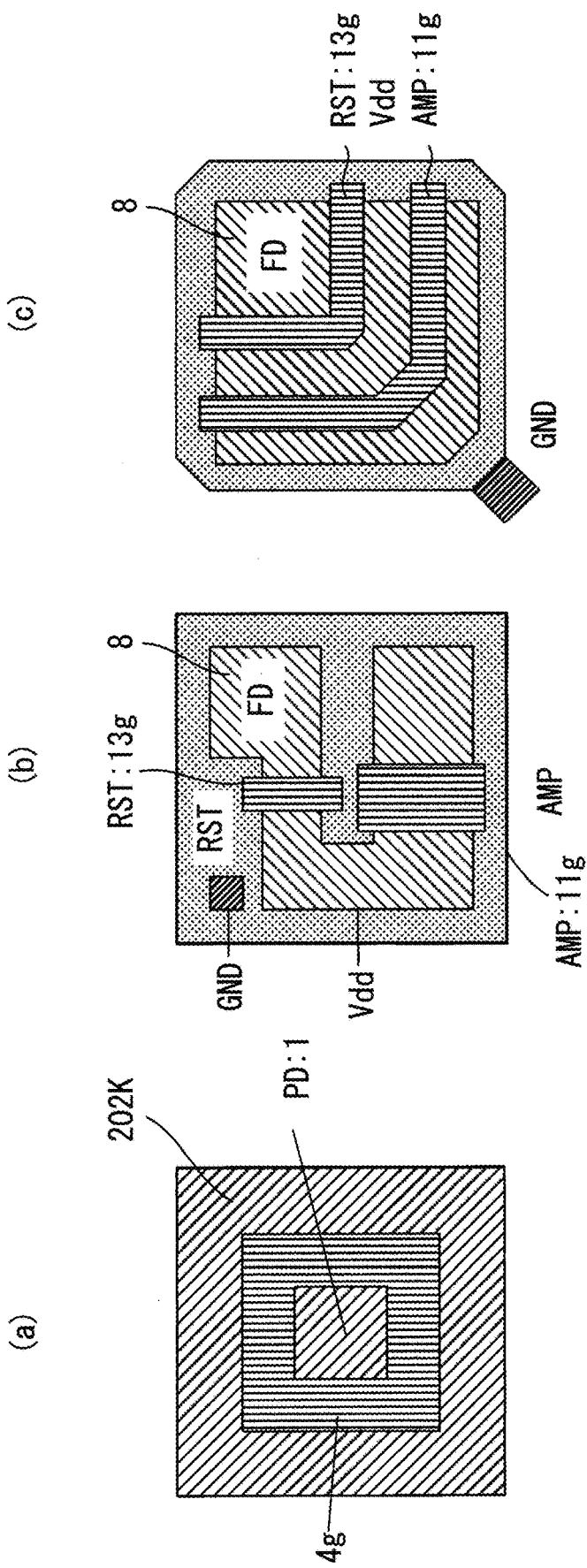
FIG. 4(a) is a traverse cross-sectional view illustrating a ring-shaped transfer gate in the first embodiment.
FIG. 4(b) is a view illustrating an exemplary arrangement as seen from a wiring surface side.
FIG. 4(c) is a view illustrating another exemplary arrangement.

FIG. 4(a) is a schematic view of an internal structure of the pixel 20 seen from the light receiving surface side, illustrating the shape of the transfer gate electrode 4g. Right-down hatching denotes a p region, and vertical hatching denotes a polysilicon region. The transfer gate electrode 4g in FIG. 4(a) is arranged to surround the p region (1b in FIG. 3). In a direction intersecting the light incident direction, the p region which serves as a transfer path is located between the transfer gate electrodes 4g. An insulating film 202s is provided between the transfer gate electrode 4g and the p region.

The PD 1 protrudes from the base region 202K of the p-type semiconductor region 202 toward the light receiving surface. The transfer gate electrode 4g of polysilicon is formed in a ring shape around the PD 1 having a prismatic shape.

Figure 5:
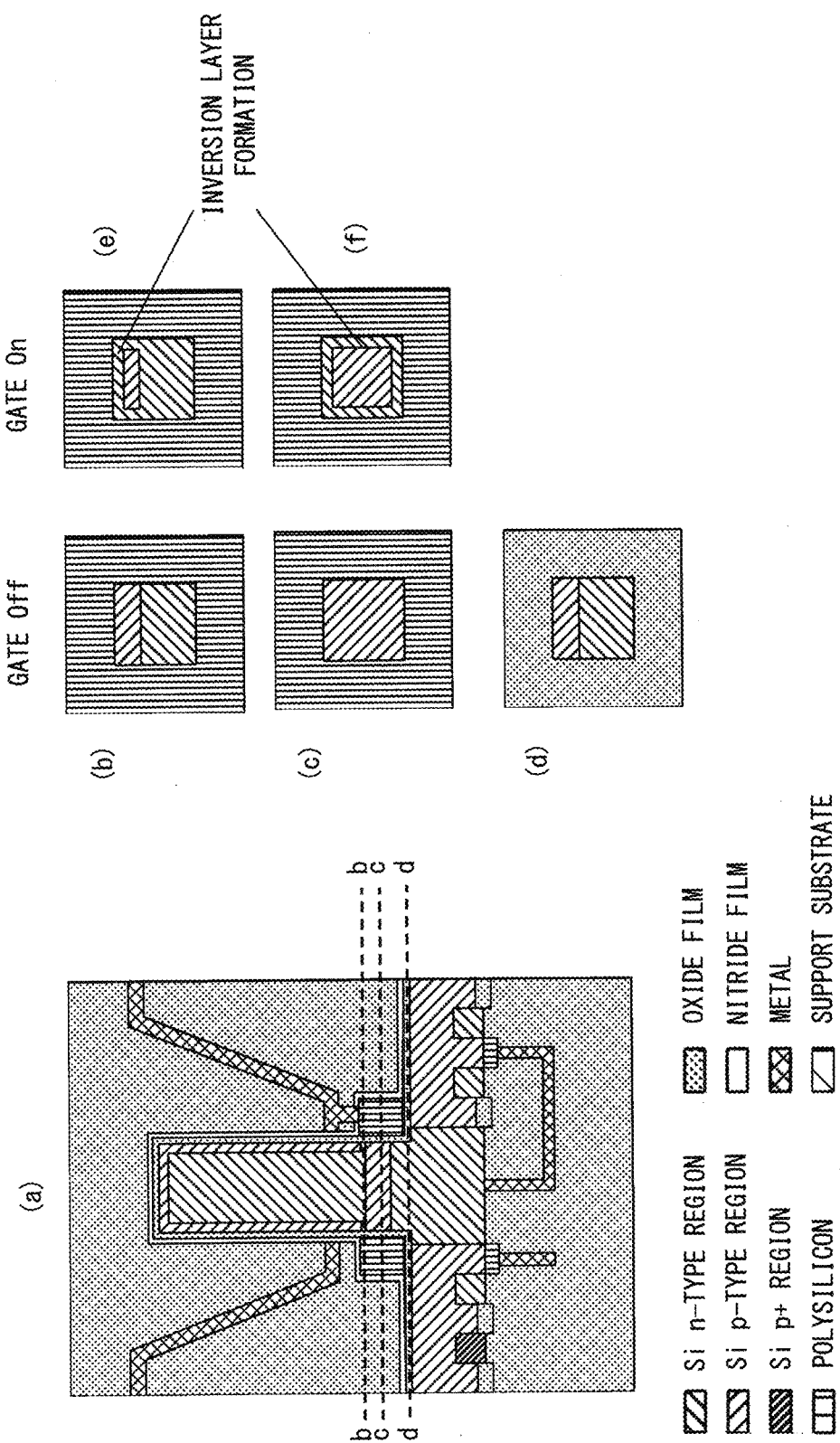
FIG. 5(a) is a cross-sectional view presenting a detailed description of a structure in the vicinity of the ring-shaped gate electrode in the first embodiment.
FIGS. 5(b), (c), and (d) are cross-sectional views taken along lines b-b, c-c, and d-d, respectively.
FIGS. 5(e), (f) are traverse cross-sectional views illustrating inversion layers formed when the transfer gate is in on state.

An electrical connection between the PD 1 and the gate electrode 4g will be described with reference to FIG. 5.

A cross section b-b in FIG. 5(a) is illustrated in FIG. 5(b), a cross section c-c in FIG. 5(a) is illustrated in FIG. 5(c), and a cross section d-d in FIG. 5(a) is illustrated in FIG. 5(d).

A p-type photoelectric conversion region 1c of the PD 1 is configured to connect to the p-type semiconductor region 1b when a voltage is applied to the gate electrode 4g. In other words, when a voltage is applied to the gate electrode, an inversion layer is formed on the entire outer periphery of the p-type photoelectric conversion region 1c in the cross section c-c. Contrastingly, a p-type region remains inside the n-type photoelectric conversion region 1a in the cross section b-b, as illustrated in FIG. 5(e). The remaining p-type region causes the p-type regions 1b, 1c to be fixed to a GND potential when the gate voltage is applied to the transfer gate electrode.

As can be seen from FIGS. 5(b), (d), the p-type photoelectric conversion region 1c is configured to connect to the p-type semiconductor region 1b even when no voltage is applied to the gate electrode 4g.

FIG. 4(b) is a schematic view illustrating an exemplary arrangement of a signal readout circuit 300 formed in the base region 202K of the p-type semiconductor region 202 as seen from the wiring surface side. Left-down hatching denotes an n region, vertical hatching denotes a polysilicon region, and a dotted region denotes an oxide film.

The reset gate electrode 13g discharges the electric charge accumulated in the FD 8 and resets the FD 8 to the reference potential Vdd, when the gate voltage is applied to a reset gate electrode 13g. The amplification transistor 11 is controlled based on a voltage of the FD 8 applied to the gate electrode 11g, and amplifies the voltage of the FD 8. A GND terminal is a terminal that sets the p-type semiconductor region 202 to the GND potential. It should be noted that a selection transistor for outputting a pixel signal to the signal readout circuit 300 may be arranged.

FIG. 4(c) is a schematic view illustrating another exemplary arrangement of the signal readout circuit 300 formed in the base region 202K of the p-type semiconductor region 202. Left-down hatching denotes an n region, vertical hatching denotes a polysilicon region, and a dotted region denotes an oxide film.

The reset gate electrode 13g resets the FD 8 to the reference potential Vdd, when the gate voltage is applied to a reset gate electrode 13g. The amplification transistor 11 is controlled based on a voltage of the FD 8 applied to the gate electrode 11g, and amplifies the voltage of the FD 8. A GND terminal is a terminal that sets the p-type semiconductor region 202 to the GND potential.

Wiring Region 203

Returning to FIG. 3, the wiring region 203 will be described. The wiring region 203 is provided with a wiring 11H connecting the FD 8 and the gate electrode 11g of the amplification transistor 11, described above, and a reset wiring 13H for supplying a gate electrode 13g of the reset transistor 13 with a gate voltage.

Oxide Film 201

A front surface of the oxide film 201, i.e., the light receiving surface (the light incident surface), which is a back surface of the semiconductor substrate 200, has a light shielding film 450 formed thereon. The light shielding film 450 is provided to prevent light incidence from onto the signal readout circuit 300 or the like. The light shielding film 450 is provided with a pyramid part 451 that is formed as a recess of a light incident region 400 recessed from the light receiving surface, in a region where light enters the PD 1. The PD 1 passes through the pyramid part 451 at the bottom portion of the light incident region 400 to extend to the light receiving surface side. An area of the light incident region 400 in the light receiving surface, that is, the contour of the edge of the pyramid part 451 on the light receiving surface side defines an opening 401 of the image sensor 100. The light shielding film 450 prevents light that enters the light incident region 400 from traveling into the signal reading circuit 300 or the like. The light shielding film 450 shields at least a part of the semiconductor region 202 from light. The light shielding film 450 also serves as a transfer wiring (denoted by reference sign 4H in FIG. 2) for providing a gate voltage to the transfer gate 4g. This will be described hereinafter.

Detailed Description of PD 1

The PD 1 will be explained in detail with reference to FIG. 3. The PD 1 is a photoelectric conversion unit having a p-n junction which is formed by selectively implanting an n-type impurity into a predetermined region of a p-type semiconductor region 202. The PD 1 is formed in a prismatic shape. An n-type photoelectric conversion region 1a is formed inside the prism, a p-type photoelectric conversion region 1b is formed to be in contact with the bottom of the n-type photoelectric conversion region 1a, and a p+ region 1c is formed on a surface of the n-type photoelectric conversion region 1a. The n-type photoelectric conversion region 1a and the p-type photoelectric conversion region 1b form a photoelectric conversion unit having a p-n junction. It should be noted that the shape of the PD 1 is not limited to the prism, but may have any three-dimensional shape extending to the light incident direction. For example, the PD 1 may be a cylinder, an elliptic cylinder, a pyramid, a cone, an elliptic cone, a sphere, an ellipsoid, a polyhedron, or other shape.

The p+ region in the surface region 1c of the PD 1 prevents a depletion layer of the photoelectric conversion region 1a from reaching the surface. Because the depletion layer is prevented from reaching the surface, a dark current generated at the semiconductor interface is prevented from flowing into the photoelectric conversion region 1a.

An n-type electric charge accumulation region 8 is formed to be in contact with the bottom of the p-type photoelectric conversion region 1b. For convenience, this n-type charge accumulation region will be explained as the FD 8.

When a gate voltage is applied to the gate electrode 4g of the transfer transistor 4, an n-type channel which is an inversion layer is formed on the surface of the p-type photoelectric conversion region 1b. Electric current flows through the channel so that an electric charge is accumulated in the FD 8.

The PD 1 protrudes from the semiconductor region 202, in which the signal readout circuit 300 is formed, to the light receiving surface side. In other words, the PD 1 is formed in the protruding region 202T that extends and protrudes from the base region 202K of the semiconductor region 202, in which the signal readout circuit 300 is formed, to the light receiving surface side. In FIG. 3, the PD 1 thus has a protruding shape that extends from the base region 202K, in which the signal readout circuit 300 is formed, to the light receiving surface side. In other words, at least a part of the PD 1 has a protrusion that extends along the light incident direction. At least a part of the PD 1 extends to the light incident direction beyond an opening 452A at the bottom of the light shielding film 452 described hereinafter and thus is closer to the light receiving surface with respect to the light shielding film 452. It should be noted that at least a part of the PD 1 may extend toward the light incident side beyond the reflection film 450 or the opening 401.

It should be noted that the direction in which the protruding PD 1 extends is a direction of an optical axis of a microlens (not shown). The light incident direction is also the direction of the optical axis of the microlens.

The protruding region 202T of the semiconductor region 202 protrudes from the substrate front surface side into a recess formed in the oxide film 201 on the light receiving surface side. The light shielding film 450 is formed on the surface defining the recess. The light shielding film 450 in the recess is the pyramid part 451 described above, and an oxide layer is deposited on an upper surface of the pyramid part 451, that is, on the recess. The recess is used as the optical path region 400. Light entered the optical path region 400 is reflected from the pyramid part 451 of the light shielding film 450 and enters the PD 1 from the side surface 1d.

Although the oxide film, for example, an oxide layer is deposited on the optical path region 400 in the above description, the inside of the optical path region 400 is not limited to the layer of oxide, but any material may be used as long as the transmittance of a visible light component is not less than a predetermined value.

The inside of the optical path region 400 may be hollow. The shape of the optical path region 400 is not limited to be rectangular. For example, the shape of the optical path region 400 may be a circle, an ellipse, a polygon, or an annular ring.

The light shielding film 450 has a bottom 452 that is formed in parallel to the light receiving surface at the lowermost end of the pyramid part 451. The protruding region 202T of the semiconductor region 202 in which the PD 1 is formed extends toward the light receiving surface through the bottom 452, that is, through the opening 452A formed in the bottom 452. Light entered the optical path region 400 is blocked by the light shielding film 452 at the bottom of the light shielding film 450, therefore the light is prevented from entering the semiconductor region 202 which exists below the oxide film 201.

In other words, a reflection film 451 is formed on an inside of an inclined surface of the optical path region 400, and the light shielding film 452 is formed on the bottom portion of the optical path region 400. The reflection film 451 and the light shielding film 452 can be formed by, for example, aluminum or other materials having high reflectance, by using PVD method. The reflection film 451 and the light shielding film 452 may be the same material or different materials, as long as the reflection film 451 is formed by a material having high reflectance and the light shielding film 452 is formed by a material having low light transmittance.

A color filter and a microlens are provided on an upper surface of the optical path region 400. The color filter may be omitted.

Photoelectric conversion operation by the above-described solid-state image sensor 100 will now be described.

The light receiving surface of the solid-state image sensor 100 has pixels arranged in a matrix. Incident light reached the image sensor 100 is condensed by a microlens which is provided for each pixel. The condensed light is wavelength-selected by the color filter 461 and then enters the optical path region 400 via the opening 401. A part of the incident light enters the inside of the PD 1 via the surface 1e thereof. The light enters the optical path region 400 except for the light enters the PD 1 via the surface 1e, i.e., the light enters the optical path region 400 between an outer side surface 1d of the PD 1 and the reflection film (the pyramid part of the light shielding film 450) 451 is reflected by the reflection film 451 and enters the PD 1 via the side surface 1d. The PD 1 photoelectrically converts the light enters via the surface 1e and the side surface 1d into an electric charge. This enables the PD 1 to more efficiently generate the electric charge from the incident light.

Light enters the bottom portion of the optical path region 400 is blocked by the light shielding film 452. The light shielding film 452 prevents the incident light from entering the semiconductor region 202 where the signal readout circuit 300 is formed. This can reduce noise generation due to light entering the readout circuit 300. Since the PD 1 has a protruding shape as described above, the light shielding film 452 has an opening 452A in a region where the PD 1 extends toward the light incident side.

If the transfer transistor 4 is turned on at a time when a predetermined accumulation time has elapsed after resetting the PD 1 and the FD 8 in the transfer transistor 4 and the reset transistor 13, a detection current based on the electric charge accumulated in the PD 1 allows the electric charge to be accumulated in the FD 8. The electric charge accumulated in the FD 8 is converted into a voltage and the voltage is applied to the gate electrode of the amplification transistor 11 and then amplified. The amplified voltage is selected as a pixel signal by a selection transistor 12 formed in a substrate (not shown) and outputted to the vertical signal line 21.

The detection current from the PD 1 to the FD 8 flows in a thickness direction of the semiconductor substrate. In other words, the detection current is vertically transferred.

In a solid-state image sensor according to PTL1, a signal readout circuit 300 that picks up an electric charge as a pixel signal transfers the signal between a transfer circuit, an amplification circuit, and a selection circuit along a surface of a semiconductor substrate.

In the solid-state image sensor 1 according to the first embodiment, the signal path from the PD 1 to the FD 8 is the thickness direction of the substrate. Accordingly, the size of the transfer transistor 4 in the in-plane direction of the substrate can be reduced. A reduction in size of the pixel can thus be achieved.

Advantageous effects of the solid-state image sensor according to the first embodiment described above are as follows.

(1) The solid-state image sensor 100 includes the semiconductor region 202 provided with the PD (the photoelectric conversion region) that photoelectrically converts incident light to generate the electric charge and the readout circuit 300 including the FD (the electric charge transfer region) 8 to which the electric charge is transferred from the PD 1. The semiconductor region 202, that is, at least a part of the PD 1 protrudes into the optical path region (the light incident region) 400 provided on the light receiving surface side.

Such a configuration of the PD 1 allows a light receiving area of the PD 1 to be increased, since the incident light enters from the surface 1*e* and the side surface 1*d* of the PD 1. This therefore leads to an increase in the S/N ratio and an improvement in the sensitivity. Additionally, this configuration avoids a deterioration in the S/N ratio due to a shorter exposure time and a deterioration in the S/N ratio associated with a smaller size of the pixel. Accordingly, a high quality image having low noise can be obtained even with a solid-state image sensor that is read at a high speed such as 1000 to 10000 frames.

(2) The PD 1 passes through the bottom portion of the optical path region 400 and extends to the light receiving surface side. The light shielding film 452 is formed at the bottom portion of the optical path region 400 so that a part of the light enters via the side surface 1*d* of the PD 1 does not travel downward in the optical path region along the side surface 1*d* of the PD 1 and does not enter from the light receiving surface side into the semiconductor region 202 where the readout circuit 300 is formed.

This results in a reduction in incident light to the readout circuit 300 and a reduction in noise generation, even in a configuration that enables light enters via side surfaces of the PD 1.

(3) The PD 1 including the n-type region 1*a*, the p-type region 1*b*, and the p+ region 1*c* extends to the light receiving surface side with respect to a surface on which the reading circuit 300 including the FD 8 is formed. The FD 8 is in contact with and directly under the p-type region 1*b*. The electric charge generated in the PD 1 is therefore vertically transferred from the PD 1 to the FD 8. In other words, the electric charge is transferred in the signal path in the thickness direction of the semiconductor substrate, instead of the horizontal transfer system which transfers the electric charge in parallel to the plane of the semiconductor substrate. As a result, pixels can be reduced in size as compared with those in conventional solid-state image sensors which horizontally transfer the electric charge of the PD 1 to the FD 8.

(4) The transfer gate electrode 4*g* of the solid-state image sensor 100 according to the first embodiment is shaped in a ring surrounding the p-type region 1*b* of the PD 1. The gate width is therefore substantially increased to improve the transfer efficiency. Furthermore, the shape of the gate electrode is point-symmetrical with respect to the optical axis of the PD 1, which can stabilize the manufacturing process.

A method of manufacturing the solid-state image sensor 100 described above will now be described. Description of mask shapes used in each processes and resist coating process or the like will be omitted hereinafter.

Figure 6:
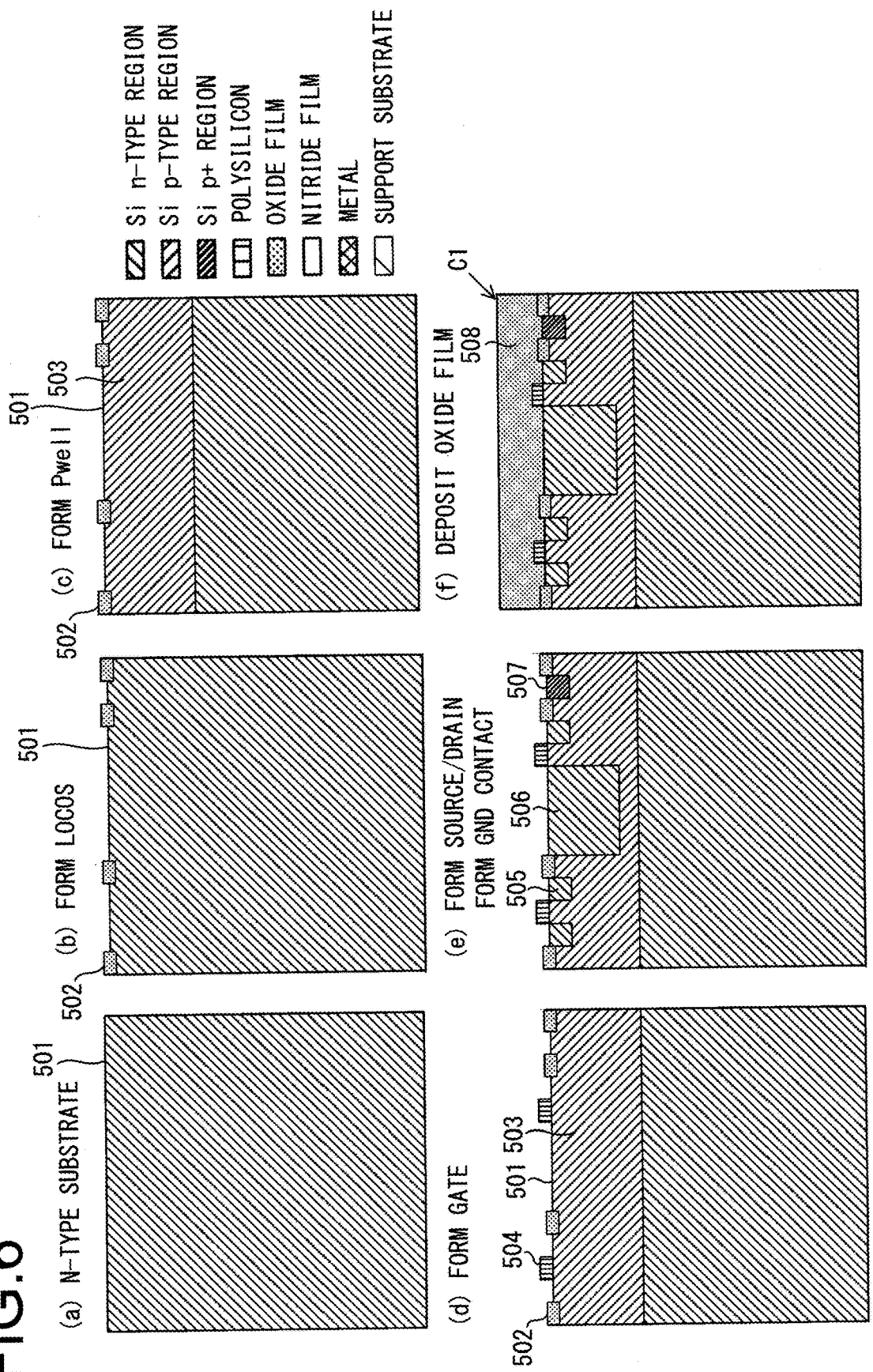
FIG. 6 is a view illustrating process in the first embodiment.

FIG. 6(*a*): an n-type semiconductor substrate 501 is prepared to manufacture the solid-state image sensor 100.

FIG. 6(*b*): a field isolation oxide film 502 is formed on an upper surface of the n-type semiconductor substrate.

FIG. 6(*c*): a p-type region 503 is formed on the upper surface side of the n-type semiconductor substrate.

FIG. 6(*d*): a gate electrode 504 of polysilicon is formed on an upper surface of the p-type region 503.

FIG. 6(*e*): a source region 505 and a drain region 506 are formed on the upper surface of the p-type region 503. Additionally, a GND contact region 507 is formed.

FIG. 6(*f*): an oxide film 508 is deposited on the upper surface of the p-type region 503.

Figure 7:
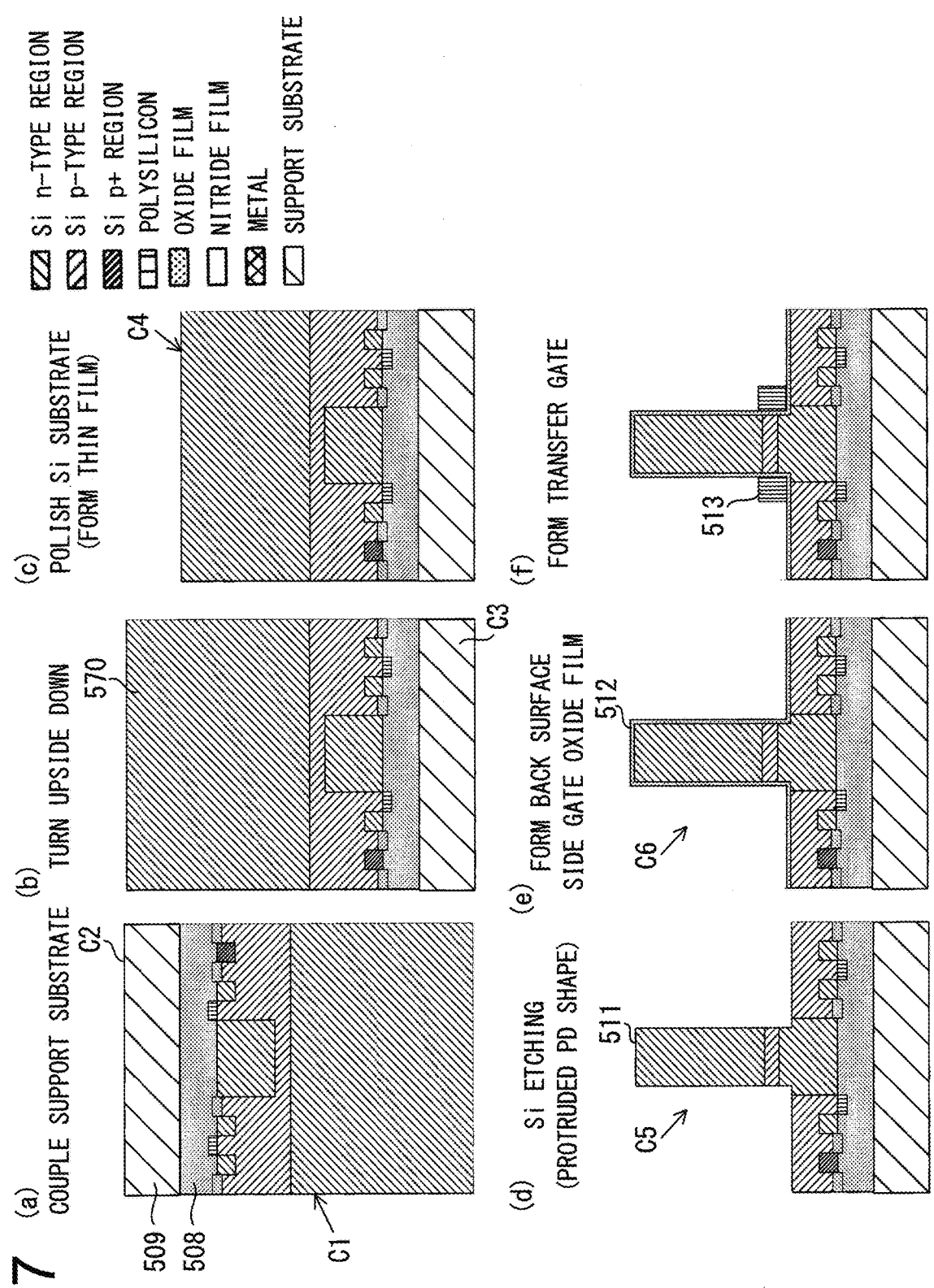
FIG. 7 is a view illustrating process in the first embodiment, subsequent to the process in FIG. 6.

FIG. 7(*a*): a support substrate 509 is coupled to an upper surface of the oxide film 508 of an intermediate product C1 after completion of the process of FIG. 6(*f*).

FIG. 7(*b*): an intermediate product C2 to which completed the process of FIG. 7(*a*) is turned upside down.

FIG. 7(*c*): the n-type region 501 of an intermediate product C3 turned upside down in FIG. 7(*b*) is polished to be a thin film.

FIG. 7(*d*): a thinned intermediate product C4 is etched to have a protruding shape from the upper n-type region 501 to the upper layer of the p-type region 503. The protruding part 511 is a region to be the PD 1 after subsequent processes.

FIG. 7(*e*): an oxide film 512 is formed on an upper surface of an intermediate product C5 that has been etched in a protruding shape.

FIG. 7(*f*): a ring-shaped gate electrode 513 (4*g*) of polysilicon is formed on the entire outer periphery of the lowermost end of the protruding part 511 of an intermediate product C6 on which the oxide film 512 is formed.

Figure 8:
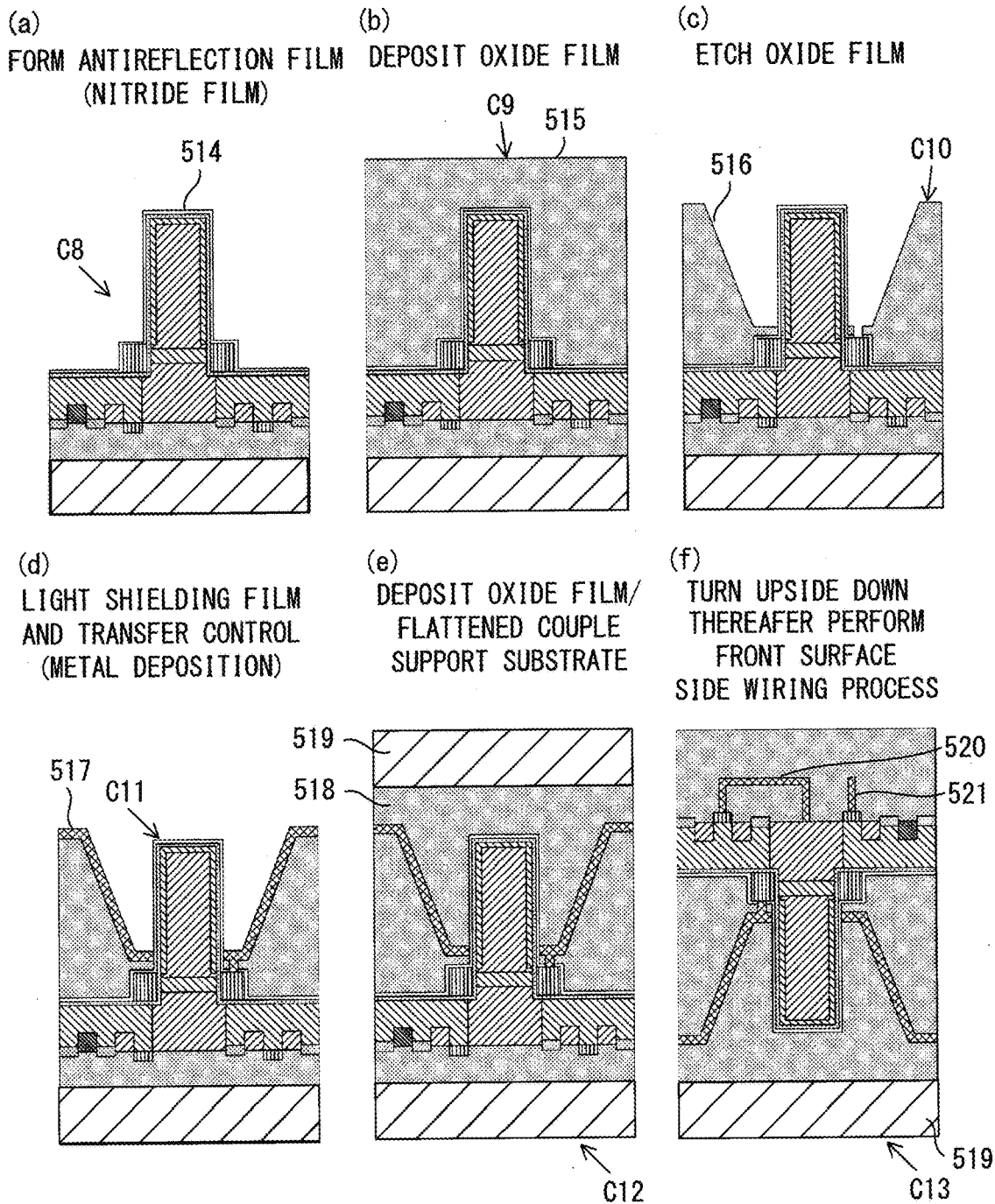
FIG. 8 is a view illustrating process in the first embodiment, subsequent to the process in FIG. 7.

FIG. 8(*a*): an antireflection nitride film 514 is formed on an upper surface of an intermediate product C7 after completion of the process of FIG. 7(*f*).

FIG. 8(*b*): an oxide film 515 is formed on an upper surface of an intermediate product C8 after completion of the process of FIG. 8(*a*).

FIG. 8(c): the oxide film 515 of an intermediate product C9 after completion of the process of FIG. 8(b) is etched to form a pyramidal recess 516 around the outer periphery of the protruding part 511.

FIG. 8(d): a light shielding film 517 (450, 451, 452) of a metal material is deposited on an upper surface of the oxide film of an intermediate product C10 after completion of the process of FIG. 8(c). The light shielding film 517 is also used as the wiring layer 4H of the gate voltage of the transfer transistor.

FIG. 8(e): an oxide film 518 is formed on an upper surface of the light shielding film 517 of an intermediate product C11 after completion of the process of FIG. 8(d). A support substrate 519 is coupled to an upper surface of the oxide film 518.

FIG. 8(f): an intermediate product C12 after completion of the process of FIG. 8(e) is turned upside down, and various wirings 520 and 521 are formed on the upper surface thereof.

Figure 9:
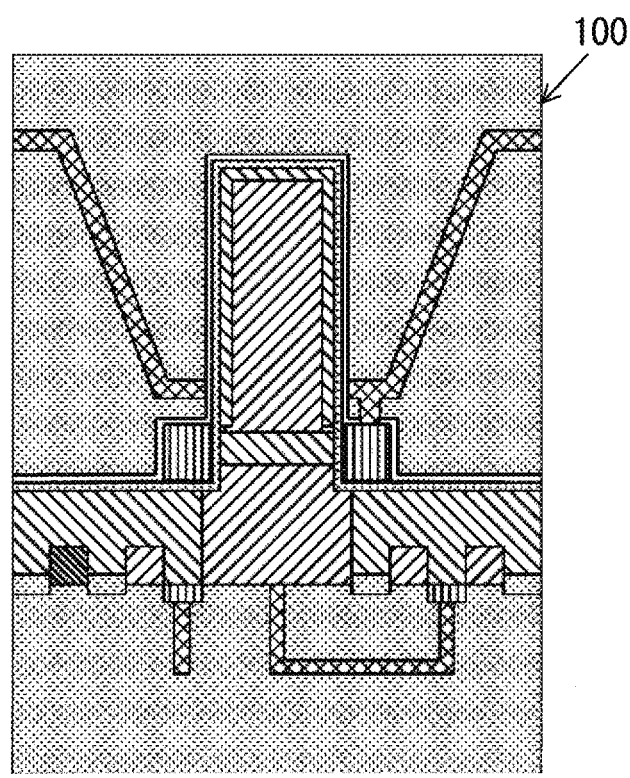
FIG. 9 is a view illustrating process in the first embodiment, subsequent to the process in FIG. 8.

FIG. 9: the support substrate 519 of an intermediate product C13 after completion of the process of FIG. 8(f) is removed and the product is turned upside down. This is the solid-state image sensor 100 described with reference to FIG. 3.

Variation of First Embodiment

FIG. 10(a) illustrates a solid-state image sensor 100R according to a variation of the first embodiment.

In the first embodiment, the transfer gate electrode 4g is formed in a ring shape. In the variation of the first embodiment, the transfer gate electrode is a U-shaped gate 4gK, a L-shaped gate 4gL, or one-side gate 4g1, as illustrated in FIGS. 10(c) to (e). FIG. 10(b) illustrates the ring-shaped gate 4g, for comparison.

As illustrated in FIG. 10(a), on the left side surface part of the PD 1 where no gate electrode is formed, the p+ region 1c and the p-type region 1b of the protruding region 202T and the p-type region 202p of the base region 202K are electrically connected. The p-type region 1b is therefore fixed to the GND potential, even if the gate is turned on.

The shape of the inversion layer formed around the p-type region 1b when the gate voltage is applied corresponds to the gate shape. As illustrated in FIGS. 10(g) to (i), the inversion layer is formed in U-shaped in the U-shaped gate 4gK, in L-shaped in the L-shaped gate 4gL, and in linear in the one side gate 4g1. FIG. 10(f) illustrates the inversion layer of the ring-shaped gate 4g, for comparison.

The solid-state image sensor 100R according to the variation of the first embodiment can also achieve similar advantageous effects as those of the first embodiment.

Other Embodiments

In the solid-state image sensor 100 described above, the FD 8 is disposed directly under the PD 1 so that the electric charge is transferred in the substrate thickness direction. In other words, the solid-state image sensor 100 has a structure in which the electric charge transfers in the vertical direction. Hereinafter, a system of transferring the electric charge in the vertical direction is referred to as a longitudinal transfer system or a vertical transfer system, and other embodiments of the system will be described.

In general, an internal quantum efficiency of an image sensor generally depends on a light absorption depth determined by a position at which a photodiode is formed and a wavelength of light. In a front illumination type pixel in which a photodiode is formed on a silicon front surface side, the shorter the wavelength is, the higher the internal quantum efficiency is, and the longer the wavelength is, the lower the internal quantum efficiency is. Contrastingly, in a back illumination type pixel, a photodiode is formed in a deep region of the silicon substrate, the longer the wavelength is, the higher the internal quantum efficiency is, and the shorter the wavelength is, the lower the internal quantum efficiency is.

If the photodiode could be formed at an optimal depth for each wavelength, instead of the photodiode formed at a certain fixed depth, the internal quantum efficiency could be enhanced for both front illumination type and back illumination type. However, it has been conventionally difficult to create such a configuration since a complete transfer would be difficult with a photodiode formed in a deep region of a silicon substrate.

A solid-state image sensor having a configuration according to each of second to fifth embodiments described below improves the sensitivity by forming a photodiode at a depth depending on a light wavelength by the use of a vertical transfer gate structure.

Second and Third Embodiments

The first embodiment has a fixed depth position of the PD from the light receiving surface, irrespective of wavelength-selected light. In a second embodiment, the depth position of the PD from the incident surface (the light receiving surface) is a position depending on wavelength-selected light, that is, a position depending on a RGB pixel. Additionally, in the second embodiment, a vertical transfer gate structure is used to transfer the electric charge from the PD to the FD.

For example, in a front illumination type pixel having color filters arranged in a Bayer array, photodiodes are formed at deep positions of a silicon layer from the substrate front surface in the order of in an R pixel, in a G pixel, and in a B pixel, and gate lengths of the vertical transfer gates 61R, 61G and 61B also vary accordingly. Contrastingly, in a back illumination type pixel, the photodiodes are formed at deep positions in the order of in a B pixel, in a G pixel, and in an R pixel, and gate lengths also vary accordingly.

Second Embodiment

Figure 11:
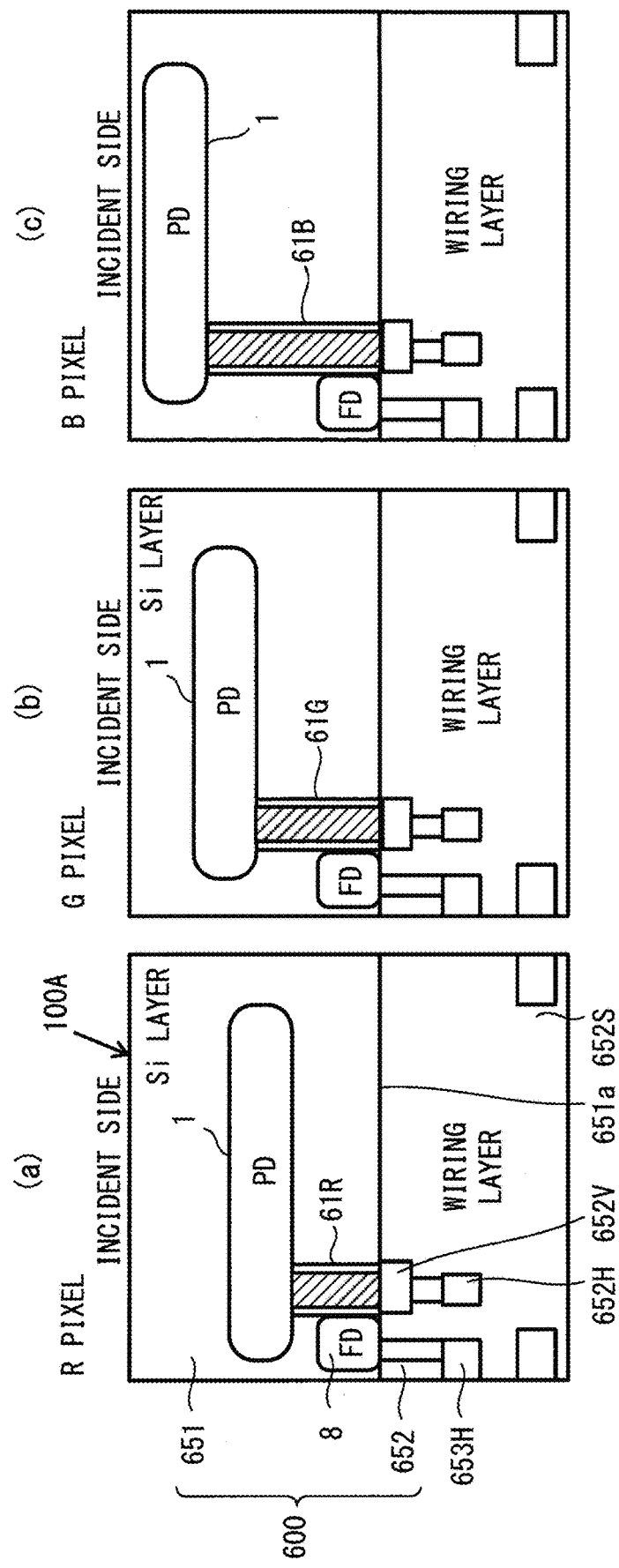
FIG. 11 is a cross-sectional view of a pixel 20 in a second embodiment.

The solid-state image sensor 100A in FIG. 11 is a back illumination type image sensor. RGB pixels are provided in a Bayer array on a semiconductor substrate 600 including a Si layer 651 and a wiring layer 652. The PD 1 is arranged at a depth depending on the wavelength of RGB and the electric charge of the PD 1 is transferred to the FD 8 via a vertical transfer gate FD 61R, 61G or 61B.

Specifically, in the Si layer 651 of the R pixel, the PD 1 is formed at a first depth position from the surface 651a of the Si layer 651 and the FD 8 is formed on the surface 651a of the Si layer 651. In the Si layer 651 of the G pixel, the PD 1 is formed at a second depth position from the surface 651a of the Si layer 651 and the FD 8 is formed on the surface 651a of the Si layer 651. In the Si layer 651 of the B pixel, the PD 1 is formed at a third depth position from the surface 651a of the Si layer 651 and the FD 8 is formed on the surface 651a of the Si layer 651. The first depth position (R pixel)<the second depth position (G pixel)<the third depth position (B pixel) is satisfied.

In each RGB pixel, the vertical transfer gate 61R, 61G or 61B (hereinafter representatively referred to as 61) is provided in the Si layer 651 to transfer the electric charge between the PD 1 and the FD 8. With respect to the gate length, the transfer gate 61R<the transfer gate 61G<the transfer gate 61B is satisfied.

The wiring layer 652 is provided with a gate electrode 652V of the vertical transfer gate 61 and a wiring layer 652H for supplying the gate electrode 652V with a gate control signal. The wiring layer 652 is also provided with a wiring 653H that transfers the potential of the FD 8 to an amplification transistor (not shown). It should be noted that the wiring layer 652 is an oxide film 652S of SiO2 or other oxide, except for the wiring.

Third Embodiment

Figure 12:
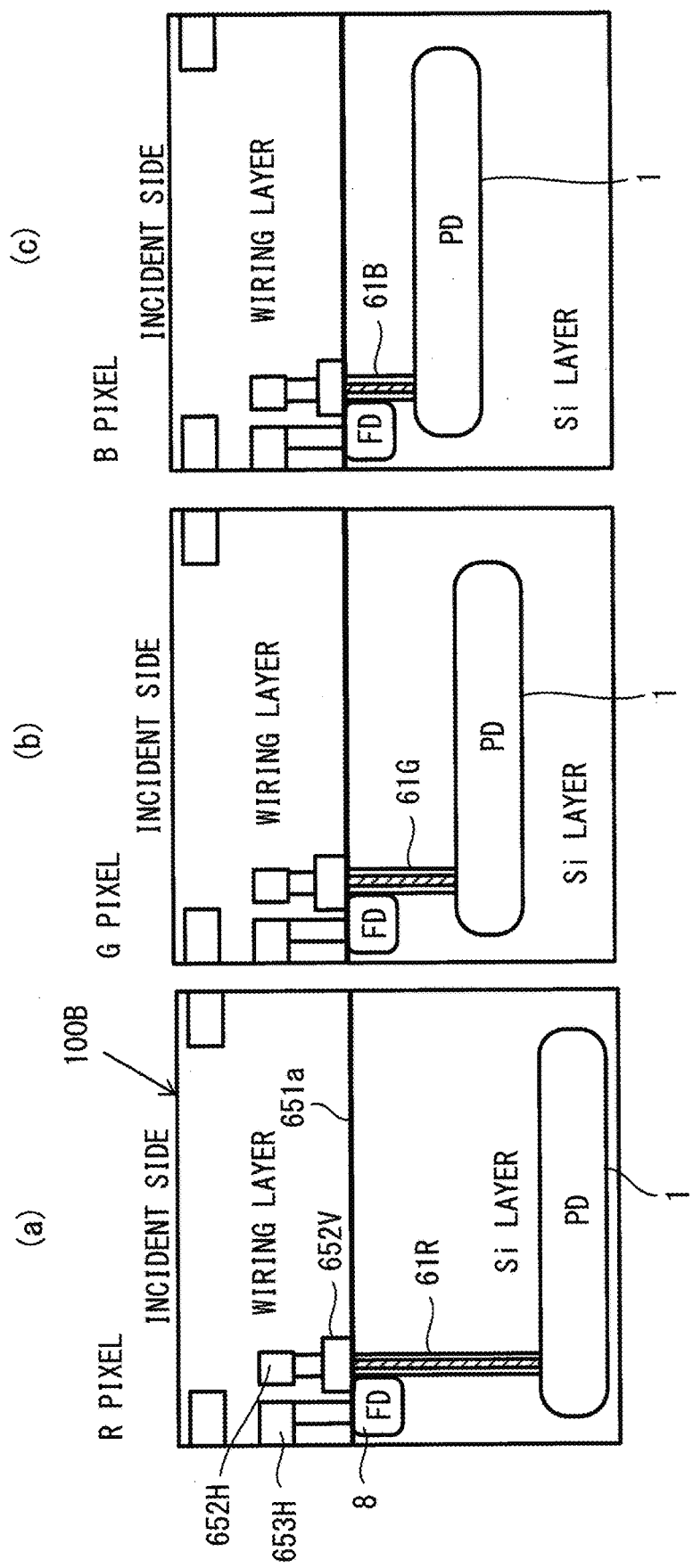
FIG. 12 is a cross-sectional view of a pixel 20 in a third embodiment.

The solid-state image sensor 100B in FIG. 12 is a front illumination type image sensor. The solid-state image sensor 100B is the element as a modification of the back illumination type solid-state image sensor 100A in FIG. 11 to a front illumination type image sensor.

Specifically, in the Si layer 651 of the R pixel, the PD 1 is formed at a fourth depth position from the surface 651a of the Si layer 651 and the FD 8 is formed on the surface 651a of the Si layer 651. In the Si layer 651 of the G pixel, the PD 1 is formed at a fifth depth position from the surface 651a of the Si layer 651 and the FD 8 is formed on the surface 651a of the Si layer 651. In the Si layer 651 of the B pixel, the PD 1 is formed at a sixth depth position from the surface 651a of the Si layer 651 and the FD 8 is formed on the surface 651a of the Si layer 651. Here, the fourth depth position (R pixel)>the fifth depth position (G pixel)>the sixth depth position (B pixel) is satisfied.

Figure 10:
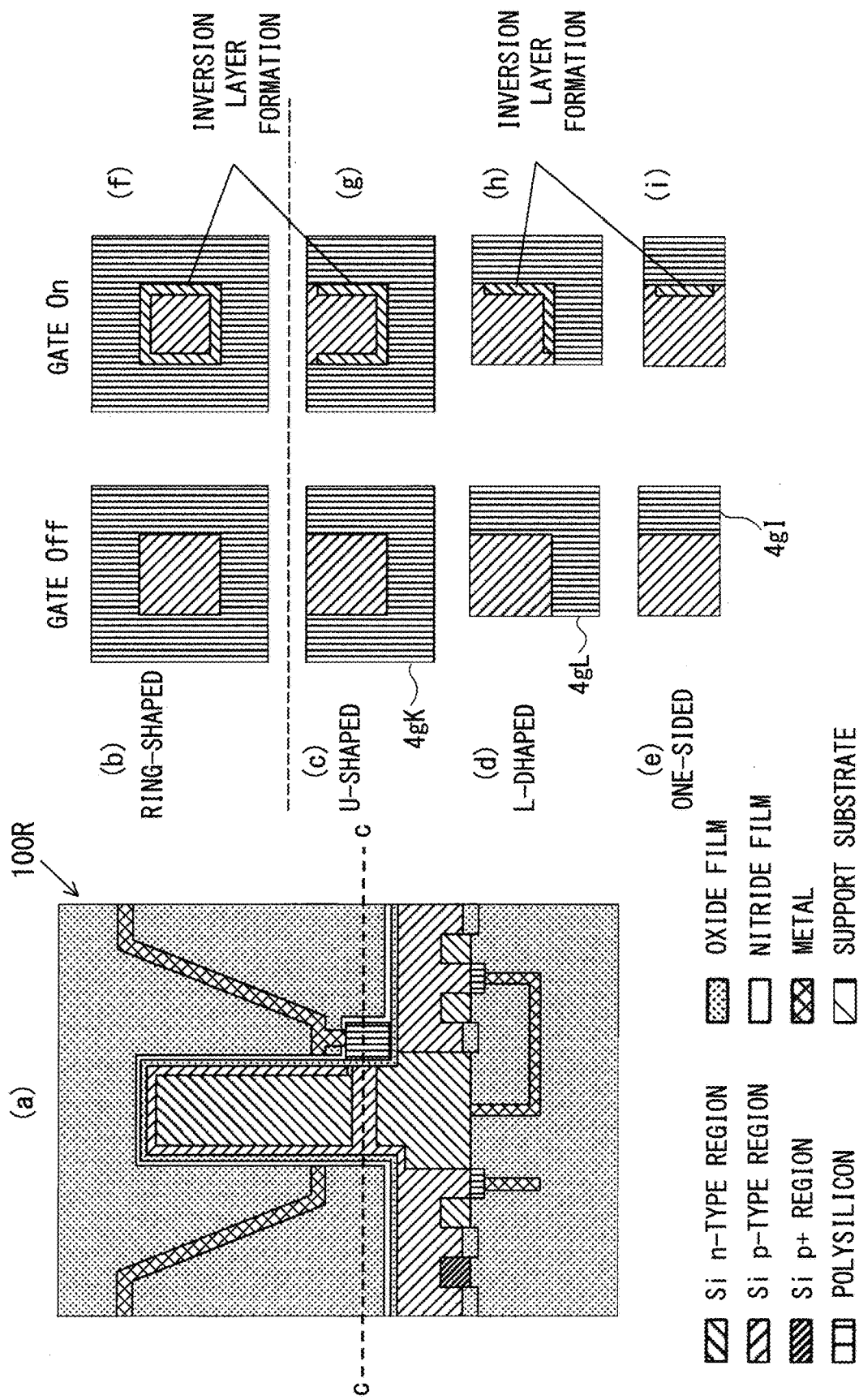
FIG. 10 is a view corresponding to FIG. 5, illustrating a variation of the transfer gate electrode.

In each RGB pixel, the vertical transfer gate 61R, 61G or 61B (hereinafter representatively referred to as 61) is provided in the Si layer 651 to transfer the electric charge between the PD 1 and the FD 8. With respect to the gate length, the transfer gate 61R>the transfer gate 61G>the transfer gate 61B is satisfied. The same parts as those in FIG. 10 are denoted by the same reference signs, and a detailed description thereof will be omitted.

The solid-state image sensors 100A and 100B according to the second and third embodiments illustrated in FIGS. 11 and 12 can achieve the following advantageous effect.

(1) Each of the solid-state image sensors 100A and 100B according to the variations illustrated in FIGS. 11 and 12 has different depths at which the photodiodes are formed in the pixel and different gate lengths of the vertical transfer gate for different colors of the color filters. Even if the PDs 1 are formed at different depths for different colors, the internal quantum efficiency can be improved without deteriorating transfer characteristics by optimizing the vertical transfer gate length and arranging the transfer gate in the vicinity of the PD 1.

Fourth Embodiment

Figure 13:
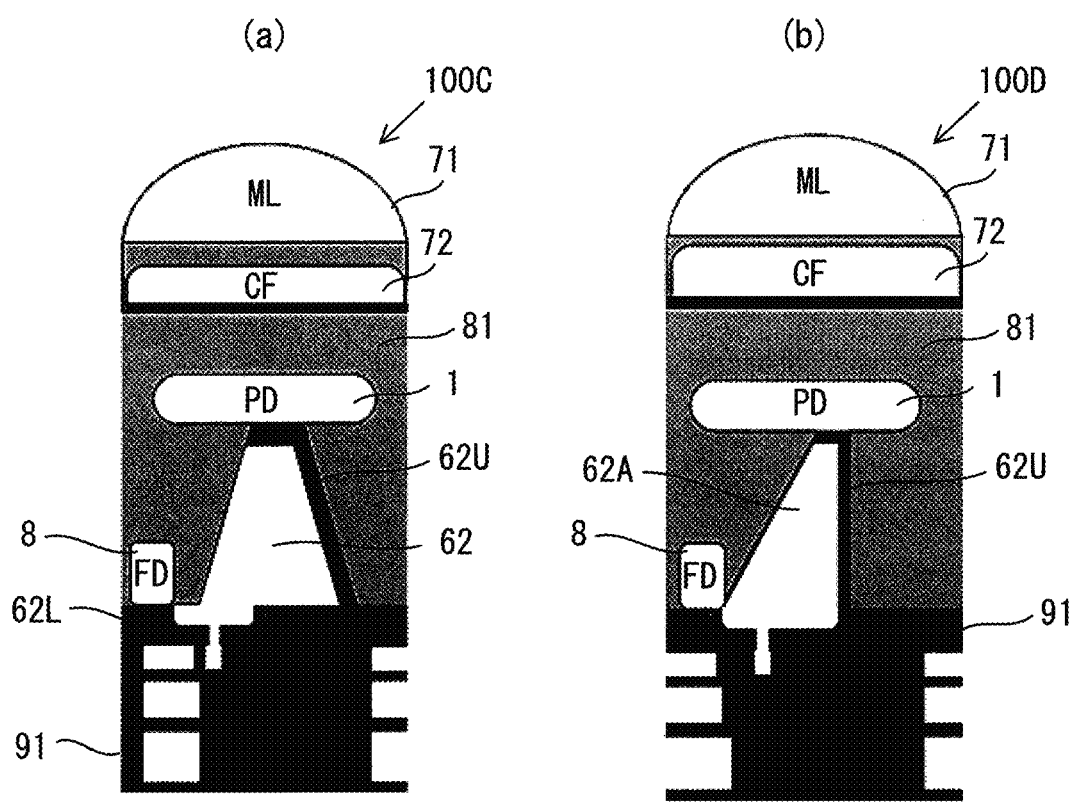
FIG. 13(a) is a cross-sectional view of a pixel 20 in a fourth embodiment and FIG. 13(b) is a cross-sectional view of a pixel 20 in a fifth embodiment.

FIG. 13(a) is a view illustrating a solid-state image sensor 100C according to a fourth embodiment. The solid-state image sensor 100C has a transfer gate having a trapezoidal longitudinal cross section, instead of the shape of the longitudinal cross section of the vertical transfer gate 61 illustrated in the second embodiment. This configuration will be described below.

Generally, in case the thickness of the Si substrate of 2.0 to 3.0 the photoelectric conversion unit needs to be formed, for enhancing the sensitivity to blue light, between a position at the half or less of the substrate thickness and the incident surface (see Japanese Laid-Open Patent Publication Nos. 2014-1499898 and 2014-225560). It is therefore necessary to form the transfer gate part to extend to a depth position at the half or more of the Si substrate thickness, that is, a length of 1.0 to 1.5 μm.

However, such a transistor structure having a long transfer gate makes it difficult to completely transfer the electric charge accumulated in the photoelectric conversion unit. Specifically, in a general vertical transfer transistor having a oxide film structure, an inversion layer is formed between the photoelectric conversion unit and the gate, which causes a residual electric charge at an interface between the photoelectric conversion unit and the gate part. This causes that the electric charge remaining after the transfer process to return to the photoelectric conversion unit, i.e. a transfer return. This transfer residue causes an afterimage.

If the thickness of the gate oxide film is uniform and the gate width is also constant in structure as in the above-described general structure, the center of the gate electrode is turned on over a longer time than the end of the gate electrode is. Thus, when the electrode is turned off, the electric charge on its way in the transfer process slightly remain near the center of the gate, which causes a transfer return.

In order to solve such a problem, the cross section of the vertical transfer gate that transfers the electric charge from the photoelectric conversion unit to the electric charge accumulation unit is shaped so that the gate cross-sectional area increases in a direction from the photoelectric conversion unit to the electric charge accumulation unit.

For example, the back illumination type solid-state image sensor 100C illustrated in FIG. 13(a) includes: a photoelectric conversion unit (PD) 1; a vertical transfer gate part 62 that is vertically formed to have a trapezoidal longitudinal cross-sectional shape and a rectangular traverse cross-sectional shape; and an electric charge accumulation unit (FD) 8 that accumulates the electric charge transferred by the vertical transfer gate part 62.

Additionally, the thickness of the oxide film 62U on the upper bottom of the vertical transfer gate part 62 is larger than the thickness of the oxide film 62L over the leg of the trapezoid and the electric charge accumulation unit 8.

It should be noted that reference sign 71 denotes a microlens, reference sign 72 denotes a color filter, reference sign 81 denotes a p-type semiconductor region, and reference sign 91 denotes a wiring layer.

The solid-state image sensor 100C according to the fourth embodiment can achieve similar advantageous effects as those of the first embodiment. Additionally, the cross-sectional area of the vertical transfer gate part 62 increases in the direction from the photoelectric conversion unit 1 to the charge accumulation unit 8, and the thickness of the oxide film 62U on the upper bottom of the vertical transfer gate part 62 is larger than the thickness of the oxide film 62L over the leg of the trapezoid and the electric charge accumulation unit 8. This reduces a potential barrier in the accumulated electric charge transfer path and improves accumulated electric charge transfer characteristics. This can also reduce the transfer residue and transfer return to prevent false color and afterimage.

In other words, the thickness of the gate oxide film is larger in the gate oxide film 62U on the upper bottom of the vertical transfer gate part 62 than in the oxide film 62L over the leg of the trapezoid and the electric charge accumulation unit 8, so that a time of the gate in on state is shorter on the PD side end than on the FD side end. Additionally, a wider cross section (gate width) on the FD side can reduce the electric charge return to the PD side, since the inversion layer gradually fades from the PD side during off state of the gate.

Fifth Embodiment

The solid-state image sensor 100D illustrated in FIG. 13(b) uses a vertical transfer gate part 62A having a right-triangular longitudinal cross section and a rectangular traverse cross section, instead of the trapezoidal vertical transfer gate part 62 in FIG. 13(a). The thickness of the oxide film 62U on the upper bottom of the vertical transfer gate part 62 is larger than the thickness of the oxide film 62L over the leg of the trapezoid and the electric charge accumulation unit 8.

The solid-state image sensor 100D according to the fifth embodiment can achieve similar advantageous effects as those of the first and fourth embodiments.

Variation of Fourth and Fifth Embodiments

The depth position of the PD 1 from the surface of the semiconductor region and the transfer gate length of the solid-state image sensor 100 C according to the fourth embodiment can be set as described in the second embodiment in FIG. 11. For application to the solid-state image sensor 100D of the front illumination type solid-state image sensor according to the fifth embodiment, the depth position of the PD 1 of the RGB pixel from the surface of the semiconductor region and the transfer gate length can be set as described in the third embodiment in FIG. 12.

Controlling the PF formation depth position and the gate length for each wavelength in this way enables similar advantageous effect as in the second embodiment to be achieved.

Sixth Embodiment

Figure 14:
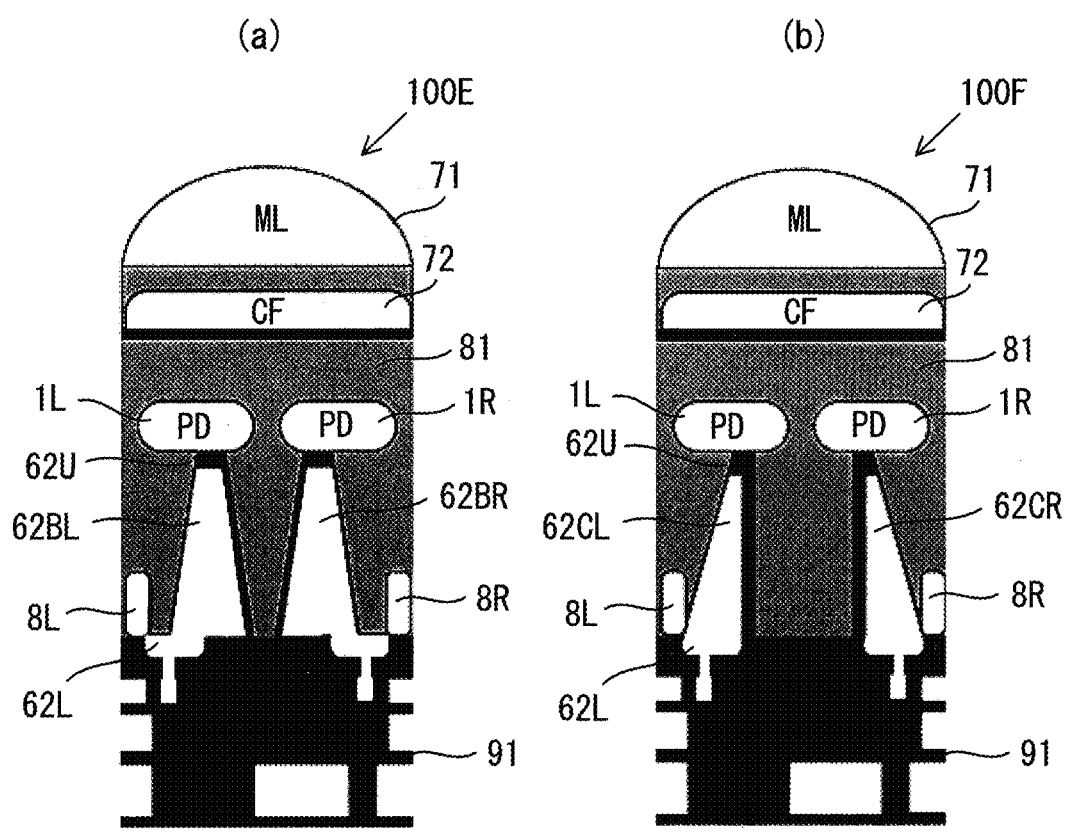
FIG. 14(a) is a cross-sectional view of a pixel 20 in a sixth embodiment and FIG. 14(b) is a cross-sectional view of a pixel 20 in a seventh embodiment.

FIG. 14(a) is a view illustrating a back illumination type solid-state image sensor 100E according to a sixth embodiment. The solid-state image sensor 100E is a so-called 2PD-type image sensor in which a pair of PDs 1L and 1R are provided in each pixel of the solid-state image sensor 100C in FIG. 13(a). The solid-state image sensor 100E is thus provided with a pair of PDs 1L, 1R and FDs 8L, 8R corresponding to the pair of PDs 1L, 1R. The electric charge of the PD 1L is transferred from a transfer gate 62BL to the FD 8L. The electric charge of the PD 1R is transferred from a transfer gate 62BR to the FD 8R. The transfer gates 62BL, BR have a trapezoidal longitudinal cross section and a rectangular traverse cross section so that the path cross-sectional area increases in a direction from the PD 1L, 1R to the FD 8L, 8R. Additionally, the thickness of the oxide film 62U on the upper bottom of the vertical transfer gate part 62A is larger than the thickness of the oxide film 62L over the leg of the trapezoid and the electric charge accumulation unit 8.

The sixth embodiment can therefore achieve similar advantageous effects as those of the fourth embodiment.

The solid-state image sensor 100E in the sixth embodiment can reduce the transfer residue and transfer return. As a result, false color and afterimage can be prevented.

The same also applies to a pixel having more (four, eight, and so on) photodiodes.

Seventh Embodiment

FIG. 14(b) is a view illustrating a solid-state image sensor 100F according to a seventh embodiment. The solid-state image sensor 100F has a transfer gate having a right-triangular longitudinal cross section, instead of the shape of the longitudinal cross section of the transfer gates 62BL, BR in FIG. 14(a). Other configurations are the same as those in the sixth embodiment and description thereof will thus be omitted herein.

Variation of Sixth and Seventh Embodiments

If the photodiode depth varies according to the wavelength in the pixel structure of the 2PD system such as the solid-state image sensors 100E, 100F illustrated in the sixth and seventh embodiments, it is necessary to form the depth of the P-type isolation at the same depth as that of the photodiode as in the variation of the sixth and seventh embodiments. It is however difficult to form a satisfactory P-type isolation structure in a deep region of the silicon. If the P-type isolation is insufficient in the deep region of the silicon, the separability deteriorates for light having a longer wavelength in the front illumination type element and contrastingly for light having a shorter wavelength in the back illumination type element. In order to achieve a high pupil division light collection rate also for light having different wavelengths, it is preferred that the PD position is thus preferably set to a predetermined depth position from the surface of the silicon layer for each wavelength.

In other words, the depth position of the PD 1 from the surface of the semiconductor region and the transfer gate length of the solid-state image sensor 100E according to the sixth embodiment are preferably set as described in the second embodiment in FIG. 11. Additionally, for application to the solid-state image sensor 100F according to the seventh embodiment of the front illumination type solid-state image sensor, the depth position of the PD 1 of the RGB pixel from the surface of the semiconductor region and the transfer gate length are preferably the same as described in the third embodiment in FIG. 12.

In this way, forming a photodiode at a depth depending on a light wavelength by the use of a vertical transfer gate structure can improve the sensitivity and also improve the separability by adjusting a photodiode aperture ratio depending on the light wavelength. Application of such a configuration enables a transistor structure to completely transfer the electric charge even if the photoelectric conversion unit is formed in a deep part of the silicon layer, which can achieve a high pupil division light collection rate.

Variation of Fourth Embodiment

Figure 15:
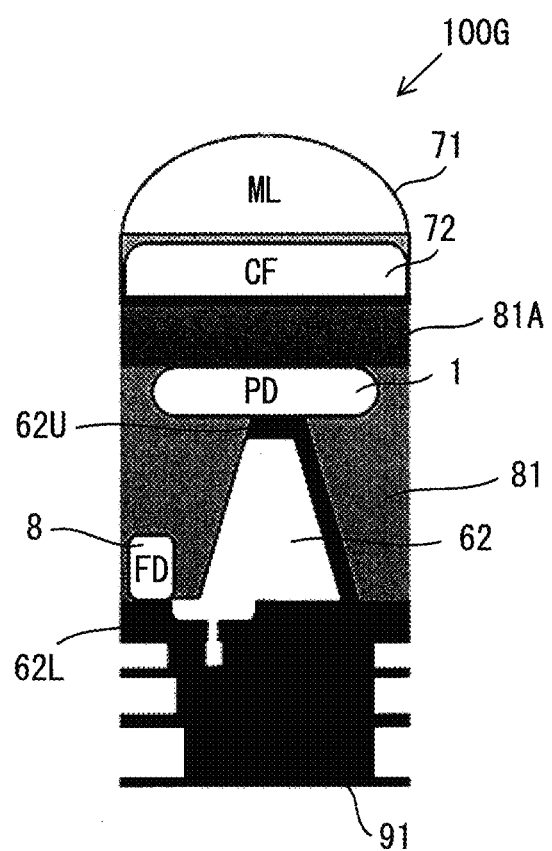
FIG. 15 is a cross-sectional view of a pixel 20 in a variation of the fourth embodiment.

In a solid-state image sensor 100G illustrated in FIG. 15, a P+ region 81A is formed in the vicinity of an upper surface of a P-epitaxial layer 81. The PD 1 is in contact with the P+ region 81A. A junction capacitance of the PD1 thus increases so that an increase in the number of saturated electrons can be expected.

It should be noted that the same parts as those in FIG. 13(a) are denoted by the same reference signs, and a description thereof will be omitted.

The solid-state image sensors according to the fourth to seventh embodiments also include those having the following configurations.

(1) A back illumination type solid-state image sensor including: a photoelectric conversion unit that is formed at an individual depth for each pixel; a gate unit that is formed to have a taper in a depth direction to read a photoelectrically converted signal resulting by the photoelectric conversion unit; a vertical transistor that is formed at a depth corresponding to the photoelectric conversion unit with the gate part as a transfer path; a floating diffusion that accumulates an electric charge transferred from the vertical transistor; and a pixel transistor including a predetermined transistor.

(2) The solid-state image sensor as described in (1), wherein the vertical transistor has a trapezoidal structure having an upper bottom that is a short side in the vicinity of the photoelectric conversion unit and a lower bottom that is a side in the vicinity of a silicon surface.

(3) The solid-state image sensor as described in (1), wherein a trapezoidal structure of the vertical transistor has an angle on the transfer path side of 75±10 degrees formed between a leg of the trapezoid and the lower bottom.

(4) The solid-state image sensor as described in (1), wherein the upper bottom of the trapezoidal structure of the vertical transistor is located in the vicinity of the photoelectric conversion unit and at a depth at which the upper bottom does not pass through the photoelectric conversion unit.

(5) The solid-state image sensor as described in (1) wherein, with respect to the trapezoidal structure of the vertical transistor, when J is a distance from a pixel edge to a center position of the upper bottom and Pt is a pixel pitch, J/Pt>½ is satisfied.

(6) The solid-state image sensor as described in (1) wherein, with respect to the trapezoidal structure of the vertical transistor, when H is a distance from a floating diffusion to a foot of a perpendicular line which is brought down from a center position of the upper bottom to the lower bottom and W is a width of the photoelectric conversion unit, W/2<H is satisfied.

(7) The solid-state image sensor as described in (1), wherein the thickness of the oxide film at the upper bottom of the trapezoidal structure of the vertical transistor is larger than the thickness of the oxide film over the leg of the trapezoid and the floating diffusion.

(8) The solid-state image sensor as described in (1), wherein, in the trapezoidal structure of the vertical transistor, a ratio L1/L2 of the thickness L1 of the oxide film at the upper bottom and the thickness L2 of the oxide film over the leg of the trapezoid and the floating diffusion is L1/L2>4.

(9) The solid-state image sensor as described in (1), wherein, in the trapezoidal structure of the vertical transistor, a ratio A1/A2 of the upper bottom A1 and the lower bottom A22 is 0≤A1/A2≤5.

(10) The solid-state image sensor as described in (1) that satisfies J1/Pt>¼ and J2/Pt>¼ in the case of a structure having two PDs in one pixel, where Pt is a pixel pitch, J1 is the center position of the left upper bottom from the left end of the pixel, and J2 is the center position of the right upper bottom from the right end of the pixel.

The solid-state image sensors according to the first to seventh embodiments described above can be described as solid-state image sensors 100 to 100F formed on a semiconductor substrate 200, in which a photoelectric conversion unit 1 that photoelectrically converts incident light to generate an electric charge; an accumulation unit 8 that accumulates the electric charge generated by the photoelectric conversion unit 1; and a transfer path that transfers the electric charge generated by the photoelectric conversion unit 1 to the accumulation unit 8 are arranged in a light incident direction, i.e., in a direction of an optical axis of a microlens.

Additionally, each of the solid-state image sensors according to the first to seventh embodiments described above includes a semiconductor substrate 200 having a first surface and a second surface, these surfaces intersect with the light incident direction, and including, between the first surface and the second surface, a photoelectric conversion unit 1 that photoelectrically converts incident light to generate an electric charge, an accumulation unit 8 that accumulates the electric charge generated by the photoelectric conversion unit 1, and a transfer path that transfers the electric charge generated by the photoelectric conversion unit 1 to the accumulation unit 8. The photoelectric conversion unit 1 is arranged on the first surface side in the light incident direction, the accumulation unit 8 is arranged on the position closer to the second surface side with respect to the photoelectric conversion unit, and the transfer path is arranged between the photoelectric conversion unit 1 and the accumulation unit 8.

Such a solid-state image sensor enables the photoelectric conversion unit, the transfer path, and the accumulation unit to be arranged in the thickness direction of the semiconductor substrate, so that pixels can be more densely mounted.

Mounting pixels with a high density is more effective, particularly in an example in which the accumulation unit 8 is arranged directly under the photoelectric conversion unit 1 and the accumulation unit 8 and the electric charge transfer path are arranged within a range of the photoelectric conversion unit 1 in a plan view of the image sensor, as in the solid-state image sensor 100 according to the first embodiment.

Furthermore, the solid-state image sensor 100 according to the first embodiment uses the vertically elongated photoelectric conversion unit 1, and the optical path region 400 is provided so that light enters not only via the surface 1e, but also via the side surface 1d of the unit 1. The photoelectric conversion efficiency is thus improved.

Eighth to Eleventh Embodiments

Each of the solid-state image sensors according to the first to seventh embodiments described above vertically transfers the electric charge between the PD and the FD. Solid-state image sensors according to eighth to eleventh embodiments below are global electronic shutter-type solid-state image sensors that have a memory unit for each pixel and vertically transfer an electric charge between the memory unit and the FD.

In order to achieve a global electronic shutter, it is necessary to transfer the electric charge accumulated in the PD to the memory and also to the PD at the same time. However, if the electric charge is transferred to the FD at the same time, a dark current from the Si interface accumulates before readout from the FD, so that the S/N ratio deteriorates. In order to solve this problem, Japanese Laid-Open Patent Publication No. 2012-9697 proposes a structure in which an accumulation memory is formed in a light shielded region of a pixel portion. However, forming the light shielded region to create the accumulation memory reduces the area of the adjacent PD, which leads to a decrease in the sensitivity.

The solid-state image sensors according to the eighth to eleventh embodiments are a MOS-type solid-state image sensors having a global electronic shutter configured to reduce accumulation of the dark current in the memory unit during the transfer from the PD to the FD, while maintaining the PD area.

Eighth Embodiment

FIG. 16(a) is a view illustrating a part of a cross section of a pixel of the front illumination type solid-state image sensor 100H according to an eighth embodiment. The semiconductor substrate 200 has a two-layer structure composed of a semiconductor region 202 and a wiring layer 203. The semiconductor region 202 is provided with an n-type region doped with an n-type ion in a p-type region formed in an n-type substrate in order to form the PD 1 having an n-p junction. The FD 8 of the n+ region is formed at the side of the PD 1 on the surface of the semiconductor region 202. A memory unit 81 is formed directly under the FD 8 of the semiconductor region 202. The FD 8 is connected to an amplification gate wiring 11H for supplying a gate electrode of an amplification transistor (not shown) with a voltage signal. The gate wiring 11H is provided in the wiring layer 203.

A first transfer gate 141 is provided between the PD 1 and the memory unit 81. A second transfer gate 142 is provided at a position at which the second transfer gate 142 sandwiches the FD 8 with the first transfer gate 141. The first and second transfer gates 141, 142 are trench-type transfer gates extending in the substrate vertical direction.

When a gate signal is inputted to the first transfer gate 141, the electric charge of the PD 1 is transferred to the memory unit 81 through the Pwell region of the semiconductor region 202, so that the electric charge is accumulated in the memory unit 81. When a gate signal is inputted to the second transfer gate 142, the electric charge of the memory unit 81 is transferred to the FD 8 through the Pwell region of the semiconductor region 202, so that the electric charge is accumulated in the FD 8. The transfer of the electric charge from the memory unit 81 to the FD 8 is vertical in a direction toward the light incident surface.

Ninth Embodiment

FIG. 16(b) is a view illustrating a part of a pixel cross section of a back illumination type solid-state image sensor 100H according to a ninth embodiment. The same parts as those in FIG. 16(a) are denoted by the same reference signs, and a description thereof will be omitted. A light shielding film 455 is formed on the light receiving surface on the light receiving surface side in order to prevent light incidence to the memory unit 81.

Tenth Embodiment

Figure 17:
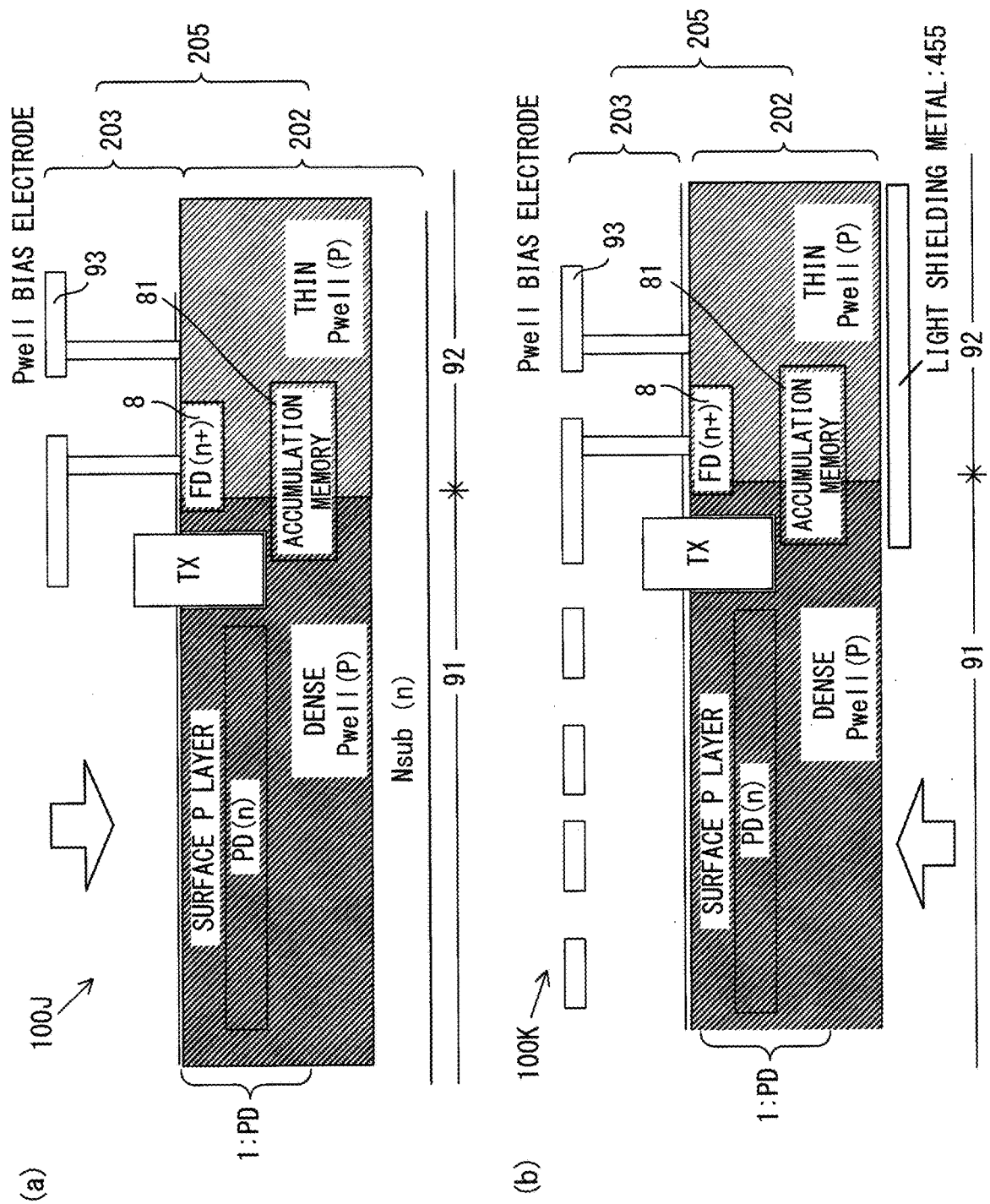
FIG. 17(a) is a cross-sectional view of a pixel 20 in a tenth embodiment and FIG. 17(b) is a cross-sectional view of a pixel 20 in an eleventh embodiment.

FIG. 17(a) illustrates a part of a pixel cross section of a front illumination type solid-state image sensor 100J according to a tenth embodiment. The same parts as those in FIG. 16(a) are denoted by the same reference signs, and a description thereof will be omitted.

In order to prevent mixing of a dark current generated at a Si interface, the Pwell region is divided into a PD part 91 having a high p-type ion concentration and a FD part 92 having a low p-type ion concentration. The FD part 92 is provided with a bias electrode 93 that applies a bias voltage to a Pwell region having a low p-type concentration.

When the bias voltage is applied via the bias electrode 93 to the Pwell region of the FD part 92, an electric charge is transferred from the memory unit 81 to the FD 8.

The same parts as those in FIG. 16(a) are denoted by the same reference signs, and a description thereof will be omitted.

Eleventh Embodiment

FIG. 17(b) is a view illustrating a part of a pixel cross section of a back illumination type solid-state image sensor 100K according to an eleventh embodiment. The same parts as those in FIG. 17(a) are denoted by the same reference signs, and a description thereof will be omitted. A light shielding film 455 is formed on the back surface side in order to prevent light incidence to the memory unit 81.

The solid-state image sensors according to the eighth to eleventh embodiments can achieve the following advantageous effects.

(1) In the solid-state image sensors 100H and 100I according to the eighth and ninth embodiments, the memory unit 81 that temporarily accumulates the electric charge can be formed under the FD 8 since the vertical transfer is achieved by the trench-type transfer gate 142. This configuration has an effect of preventing accumulation of a dark current component from the Si interface since the memory unit 81 can be embedded.

(2) In the solid-state image sensors 100H and 100I according to the eighth and ninth embodiments, the memory unit 81 is arranged directly under the FD 8 in a semiconductor region between the trench-type transfer gates 141 and 142. Incident light from the light receiving surface can be prevented from entering the memory unit 81, which reduces noise.

(3) In the back illumination type solid-state image sensors 100I, 100K of the ninth and eleventh embodiments, the light shielding film 455 is formed on the back surface side of the memory unit 81 so that the memory unit 81 can be shielded from light, which can result in a reduction in noise due to light leakage.

(4) In the solid-state image sensors 100J, 100K according to tenth and eleventh embodiments, a bias potential is applied via the bias electrode 93 to the Pwell region of the FD part 81 having a low p-type ion concentration to extend a depletion layer region between the memory unit 81 and the FD 8, and the electric charge is transferred by joining the memory unit 81 and the FD 8. This configuration has an effect of further reducing the dark current at the Si interface during the transfer.

Thus, the solid-state image sensors according to the eighth to eleventh embodiments can provide a global electronic shutter having an excellent S/N ratio.

The solid-state image sensors according to the eighth to eleventh embodiments also include those having the following configurations.

(1) A solid-state image sensor including: a PD 1; a FD 8 that detects an electric charge; a memory unit 81 that temporarily stores the electric charge accumulated in the PD 1; an embedded type transfer gate 141 for transferring the electric charge from the PD 1 to the memory unit 81; and an embedded type transfer gate 142 for transferring the electric charge from the memory unit 8 to the FD 8, wherein: the memory unit 81 is at least partly formed under the FD.

(2) The back illumination type solid-state image sensor as described in (1), including a light shielding film 455 that shields the memory unit 81 from incident light, on the back surface side.

(3) A solid-state image sensor including: a PD 1; a FD 8 that detects an electric charge; a memory unit 81 that temporarily stores the electric charge accumulated in the PD 1; an embedded type transfer gate 141 for transferring the electric charge from the PD 1 to the memory unit 81; a P-type or N-type well region formed in a region from the FD 8 to the PD 1; a P-type or N-type well region that is to be a region joining the memory unit 81 and the FD 8; and a P-type or N-type well bias electrode 93 that controls a P-type or N-type well potential in the region joining the memory unit 81 and the FD 8, wherein the memory unit 81 is at least partly formed under the FD 8.

(4) The back illumination type solid-state image sensor as described in (3), including a light shielding film 455 that shields the memory unit 81 from incident light, on the back surface side.

The solid-state image sensor according to the present invention is not limited to the embodiments and variations described above. The following solid-state image sensors are also encompassed within the present invention. Such solid-state image sensors will be described with reference to the drawings.

(1) A solid-state image sensor formed on a semiconductor substrate 200 includes a semiconductor substrate having a first surface and a second surface and including, between the first surface and the second surface, a photoelectric conversion unit 1 that photoelectrically converts incident light to generate an electric charge, an accumulation unit 8 that accumulates the electric charge generated by the photoelectric conversion unit 1, and a transfer path 4 that transfers the electric charge generated by the photoelectric conversion unit 1 to the accumulation unit 8. The photoelectric conversion unit 1 is arranged on the first surface side with respect to the light incident direction, the accumulation unit 8 is arranged on the position closer to the second surface side with respect to the photoelectric conversion unit, and the transfer path 4 is arranged between the photoelectric conversion unit 1 and the accumulation unit 8.

The photoelectric conversion unit 1, the accumulation unit 8, and the transfer path 4 are arranged between the first surface and the second surface of the semiconductor substrate 200. The first surface is a direction intersecting the light incident direction. The photoelectric conversion unit 1, the accumulation unit 8, and the transfer path 4 are arranged in the light incident direction, which contributes to a reduction in size of the pixel.

(2) In the image sensor described in (1) above, the first surface is a light receiving surface onto which light enters.

(3) In the image sensor as described in (1) above, the semiconductor substrate 200 has a protruding region 202T having a protruding shape extending from a flat plate-like base region 202K toward the light receiving surface onto which the light enters, and the photoelectric conversion unit 1 extends toward the light receiving surface in the protruding region 202T.

(4) In the image sensor as described in (3) above, an amplification transistor 11 that amplifies an output of the accumulation unit 8 is provided on the second surface side of the base region 202K.

(5) In the image sensor as described in (1) above, the transfer path includes the transfer transistor 4 that transfers the electric charge of the photoelectric conversion unit 1 to the accumulation unit 8, and the gate electrode 4g of the transfer transistor 4 is an annular electrode provided on the first surface side and surrounding the accumulation unit 8.

(6) In the image sensor as described in (5) above, an incident optical path 400 is provided around the photoelectric conversion unit 1 to guide incident light from an opening 401 provided in the light receiving surface to the photoelectric conversion unit 1. The incident optical path 400 has an opening 401 and partitioned by a light shielding film 450 that blocks incidence of light to the accumulation unit 8, wherein the light shielding film 450 is a wiring path for a drive signal to the gate electrode 4g of the transfer transistor 4.

Since the light traveling through the optical path region 400 enters the photoelectric conversion unit 1 from a plurality of directions, the electric charge generated by the light can be increased. In other words, the quantum effect can be enhanced.

(7) In the image sensors as described in (1) to (6) above, the photoelectric conversion unit 1 and the accumulation unit 8 are arranged to overlap each other as seen from the light receiving surface of the semiconductor substrate 200 onto which light enters. This can result in a reduction in size of the pixel.

(8) In the image sensors as described in (1) to (6) above, a light opening 401 is formed in the light receiving surface of the semiconductor substrate 200 onto which light enters, and the photoelectric conversion unit 1 and the accumulation unit 8 are arranged to overlap each other in a range of the opening 401 as seen from the opening 401. This enables a reduction in size of the pixel.

(9) In the image sensor as described in (4) above, a selection unit 12 that selects a signal amplified by the amplification transistor 11 is formed on the other semiconductor substrate which is different from the semiconductor substrate 202, and the other semiconductor substrate is stacked on the semiconductor substrate 202.

Figure 18:
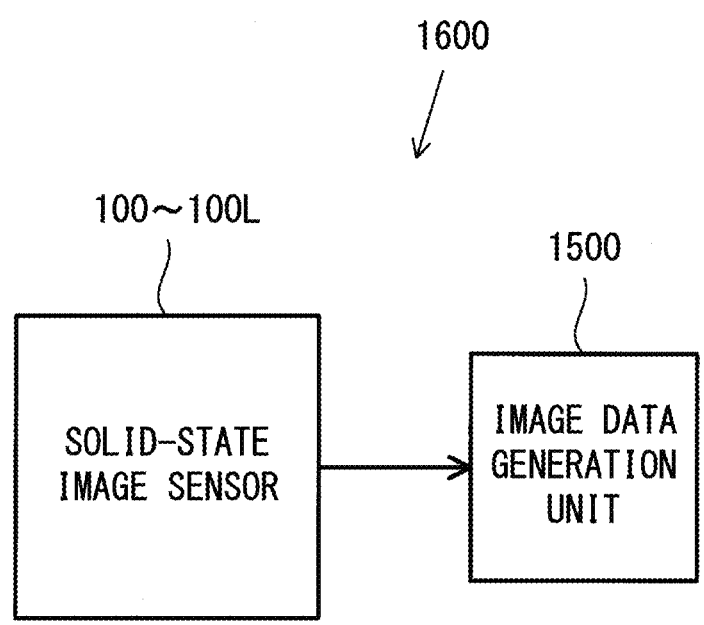
FIG. 18 is a block diagram illustrating an image-capturing device according to the present invention.

Further, as illustrated in FIG. 18, the present invention may be implemented as an image-capturing device 1600 including an image sensor 100 in one of the embodiments and variations described above and a generation unit 1500 that generates image data based on signals outputted from the image sensor 100.

The disclosure of the following priority application is herein incorporated by reference:

Japanese Patent Application No. 2015-195346 (filed Sep. 30, 2015)

REFERENCE SIGNS LIST

1 . . . photodiode, 1a n-type photoelectric conversion region, 1b . . . p-type photoelectric conversion region, 1c . . . surface region, 1d . . . side surface, 1e . . . surface, 4 . . . transfer transistor, 4g . . . transfer gate electrode, 4H . . . transfer wiring, 8 . . . floating diffusion, 11 . . . amplification transistor, 12 . . . selection transistor, 13 . . . reset transistor, 20 . . . pixel, 21 . . . vertical signal line, 61, 61R, 61G 61B, 62, 141, 142 . . . vertical transfer gate, 81 . . . memory unit, 91 . . . PD part, 92 . . . FD part, 93 . . . bias electrode, 100 to 100K . . . solid-state image sensor, 200 . . . semiconductor substrate, 201 . . . oxide film, 202 . . . semiconductor region, 203 . . . wiring region, 202K . . . base region, 202T . . . protruding region, 400 . . . optical path region, 401 . . . opening, 450, 452 . . . light shielding film, 451 . . . reflection film

The invention claimed is:

1. An image sensor, comprising:
a photoelectric conversion unit that photoelectrically converts light transmitted through a microlens to generate electric charge;
an accumulation unit that accumulates the electric charge generated by the photoelectric conversion unit; and
a light shielding unit that blocks light that enters the accumulation unit,
wherein:
a part of the photoelectric conversion unit is provided closer to the microlens in comparison with the light shielding unit with respect to a direction of an optical axis of the microlens; and
parts other than the part of the photoelectric conversion unit is provided closer to the accumulation unit in comparison with the light shielding unit with respect to the direction of the optical axis of the microlens.

2. The image sensor according to claim 1, comprising:

a transfer unit that transfers the electric charge generated by the photoelectric conversion unit to the accumulation unit, wherein:

the transfer unit is provided between the photoelectric conversion unit and the accumulation unit with respect to the direction of the optical axis of the microlens.

3. The image sensor according to claim 2, wherein:

the transfer unit is a transfer path that transfers the electric charge generated by the photoelectric conversion unit to the accumulation unit.

4. The image sensor according to claim 1, comprising:

an electrode that is provided around the accumulation unit and forms a transfer path for transferring the electric charge generated by the photoelectric conversion unit to the accumulation unit.

5. The image sensor according to claim 4, wherein:

the electrode is provided to at least partly surround the transfer path.

6. The image sensor according to claim 1, wherein the photoelectric conversion unit receives the light transmitted through the microlens, between the microlens and the light shielding unit.

7. The image sensor according to claim 1, wherein:

the photoelectric conversion unit has a light receiving surface that receives light entered from a direction that intersects the optical axis of the microlens, between the microlens and the light shielding unit.

8. The image sensor according to claim 1, wherein:

the photoelectric conversion unit has a plurality of light receiving surfaces that receive light transmitted through the microlens, between the microlens and the light shielding unit.

9. The image sensor according to claim 1, wherein:

at least a part of the photoelectric conversion unit protrudes to be closer to the microlens in comparison with the light shielding unit.

10. The image sensor according to claim 1, wherein:

the light shielding unit has an opening; and at least a part of the photoelectric conversion unit protrudes from the opening beyond the light shielding unit to the light incident side.

11. An image-capturing device, comprising:

an image sensor according to claim 1; and a generation unit that generates image data based on a signal outputted from the image sensor.

12. The image sensor according to claim 1, wherein:

the light shielding unit has an opening; and at least a part of the photoelectric conversion unit passes through the opening.

13. The image sensor according to claim 1, comprising:

a transfer unit that transfers the electric charge generated by the photoelectric conversion unit to the accumulation unit, wherein:

the photoelectric conversion unit, the transfer unit, and the accumulation unit are provided along the direction of the optical axis of the microlens.

14. The image sensor according to claim 1, comprising:

a transfer unit that transfers the electric charge generated by the photoelectric conversion unit to the accumulation unit, wherein:

the photoelectric conversion unit, the transfer unit, and the accumulation unit are provided in an order of the photoelectric conversion unit, the transfer unit, and the accumulation unit along the direction of the optical axis of the microlens.

15. The image sensor according to claim 1, comprising:

a transfer unit that transfers the electric charge generated by the photoelectric conversion unit to the accumulation unit, wherein:

the photoelectric conversion unit, the transfer unit, and the accumulation unit are provided on the optical axis of the microlens.

16. The image sensor according to claim 1, comprising:

a transfer unit that transfers the electric charge generated by the photoelectric conversion unit to the accumulation unit, wherein:

the photoelectric conversion unit, the transfer unit, and the accumulation unit are provided in an order of the photoelectric conversion unit, the transfer unit, and the accumulation unit on the optical axis of the microlens.

* * * * *